United States Patent
Koyama et al.

(10) Patent No.: US 9,374,048 B2
(45) Date of Patent: Jun. 21, 2016

(54) SIGNAL PROCESSING DEVICE, AND DRIVING METHOD AND PROGRAM THEREOF

(71) Applicant: SEMICONDUCTOR ENERGY LABORATORY CO., LTD., Atsugi-shi, Kanagawa-ken (JP)

(72) Inventors: Jun Koyama, Kanagawa (JP); Kei Takahashi, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/462,007

(22) Filed: Aug. 18, 2014

(65) Prior Publication Data
US 2015/0054550 A1 Feb. 26, 2015

(30) Foreign Application Priority Data
Aug. 20, 2013 (JP) ................. 2013-170067

(51) Int. Cl.
*H03K 3/012* (2006.01)
*H03F 3/04* (2006.01)
*H03F 3/45* (2006.01)
(Continued)

(52) U.S. Cl.
CPC .......... *H03F 3/45183* (2013.01); *H03F 1/0261* (2013.01); *H03F 3/193* (2013.01); *H03F 2200/555* (2013.01)

(58) Field of Classification Search
USPC ......................................... 330/285, 296, 277
See application file for complete search history.

(56) References Cited

U.S. PATENT DOCUMENTS

| 5,493,255 A | 2/1996 | Murtojarvi |
| 5,497,119 A | 3/1996 | Tedrow et al. |
| 5,546,042 A | 8/1996 | Tedrow et al. |

(Continued)

FOREIGN PATENT DOCUMENTS

| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Hieu Nguyen
(74) *Attorney, Agent, or Firm* — Fish & Richardson P.C.

(57) ABSTRACT

A power switch 307a is provided between a bias generation circuit 301 and a high potential power source, or a power switch 307b is provided between the bias generation circuit 301 and a low potential power source. A bias potential Vb output from the bias generation circuit 301 is held by a potential holding circuit 300. The bias potential Vb held by the potential holding circuit 300 is input to a bias generation circuit 301a, and a bias potential Vb2 output from the bias generation circuit 301a on which an input signal IN is superimposed is input to an amplifier circuit 302. The potential holding circuit 300 is constituted of a capacitor 306 and a switch 305 formed of, for example, a transistor with a low off-state current that is formed using a wide band gap oxide semiconductor. Structures other than the above structure are claimed.

13 Claims, 21 Drawing Sheets

(51) Int. Cl.
*H03F 1/02* (2006.01)
*H03F 3/193* (2006.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,936,455 A | 8/1999 | Kobayashi et al. |
| 6,294,274 B1 | 9/2001 | Kawazoe et al. |
| 6,549,196 B1 | 4/2003 | Taguchi et al. |
| 6,559,628 B2 | 5/2003 | Kim |
| 6,563,174 B2 | 5/2003 | Kawasaki et al. |
| 6,696,869 B1 | 2/2004 | Tan |
| 6,727,522 B1 | 4/2004 | Kawasaki et al. |
| 6,794,916 B1 | 9/2004 | Varma |
| 6,888,526 B2 | 5/2005 | Morita |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,277,038 B2 | 10/2007 | Yada et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,538,673 B2 | 5/2009 | Balachandran et al. |
| 7,674,650 B2 | 3/2010 | Akimoto et al. |
| 7,732,819 B2 | 6/2010 | Akimoto et al. |
| 8,294,380 B2 | 10/2012 | Bairanzade |
| 8,467,825 B2 | 6/2013 | Kato et al. |
| 8,598,953 B2 * | 12/2013 | Fisher .............. H03F 1/302 330/285 |
| 2001/0046027 A1 | 11/2001 | Tai et al. |
| 2002/0000985 A1 | 1/2002 | Hashimoto |
| 2002/0056838 A1 | 5/2002 | Ogawa |
| 2002/0084775 A1 | 7/2002 | Kim |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0150653 A1 | 8/2004 | Sakamaki et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0152400 A1 | 7/2006 | Yada et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0255874 A1 | 11/2006 | Okazaki et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0046474 A1 | 3/2007 | Balachandran et al. |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320925 A1 | 12/2010 | Bairanzade |
| 2011/0012822 A1 | 1/2011 | Park et al. |
| 2011/0074508 A1 | 3/2011 | Imura |
| 2012/0049901 A1 | 3/2012 | Takewaki et al. |
| 2012/0176392 A1 | 7/2012 | Uchida et al. |
| 2013/0162227 A1 | 6/2013 | Kodama et al. |
| 2013/0271220 A1 | 10/2013 | Takahashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the IN2O3 and SC2O3—A2O3—BO Systems [A; FE, , GA, or, AL; B: MG, MN, FE, NI, CU,or ZN] At Temperatures Over 1000°C", Journal of Solid State Chemistry, 1985, vol. 60, pp. 382-384.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimenstional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "Rfcpus on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-in. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Techincal Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:AN and SN-Doped Zinc Indium Oxide Thin Film Transistors for AMOLED Back Plane", SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digst of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09 : Technical Digest of International Electron Devices Meeting, Dec. 7, 2009, pp. 191-194.

Nakamura.M "Synthesis of Homologous Compound with New Long-Period Structure", NIRIM Newsletter, Mar. 1, 1995, vol. 150, pp. 1-4.

(56) References Cited

OTHER PUBLICATIONS

Hosono.H et al., "Working hypothesis to explore novel wide band gap electrically conducting amorphous oxides and Examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B) Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122101-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Techincal Papers, May 20, 2008, vol. 39, pp. 1277-1280.

Oba.F et al., "Defect energetics in ZnO: A hybrid Hartree-Fock density functional study", Phys. Rev. B. (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '8 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

RFAMP1

SGa  VDD  SGb or SGc

IN  OUT

GND

VDD

401a — Timer → To RFAMP1, To RFAMP2, To RFAMP3 } SGa

401b — Timer → To RFAMP1, To RFAMP2, To RFAMP3 } SGb or SGc

402 CLKGEN

401c — Timer → To RFAMP1, To RFAMP2, To RFAMP3 } SGa

401d — Timer → To RFAMP1, To RFAMP2, To RFAMP3 } SGb or SGc

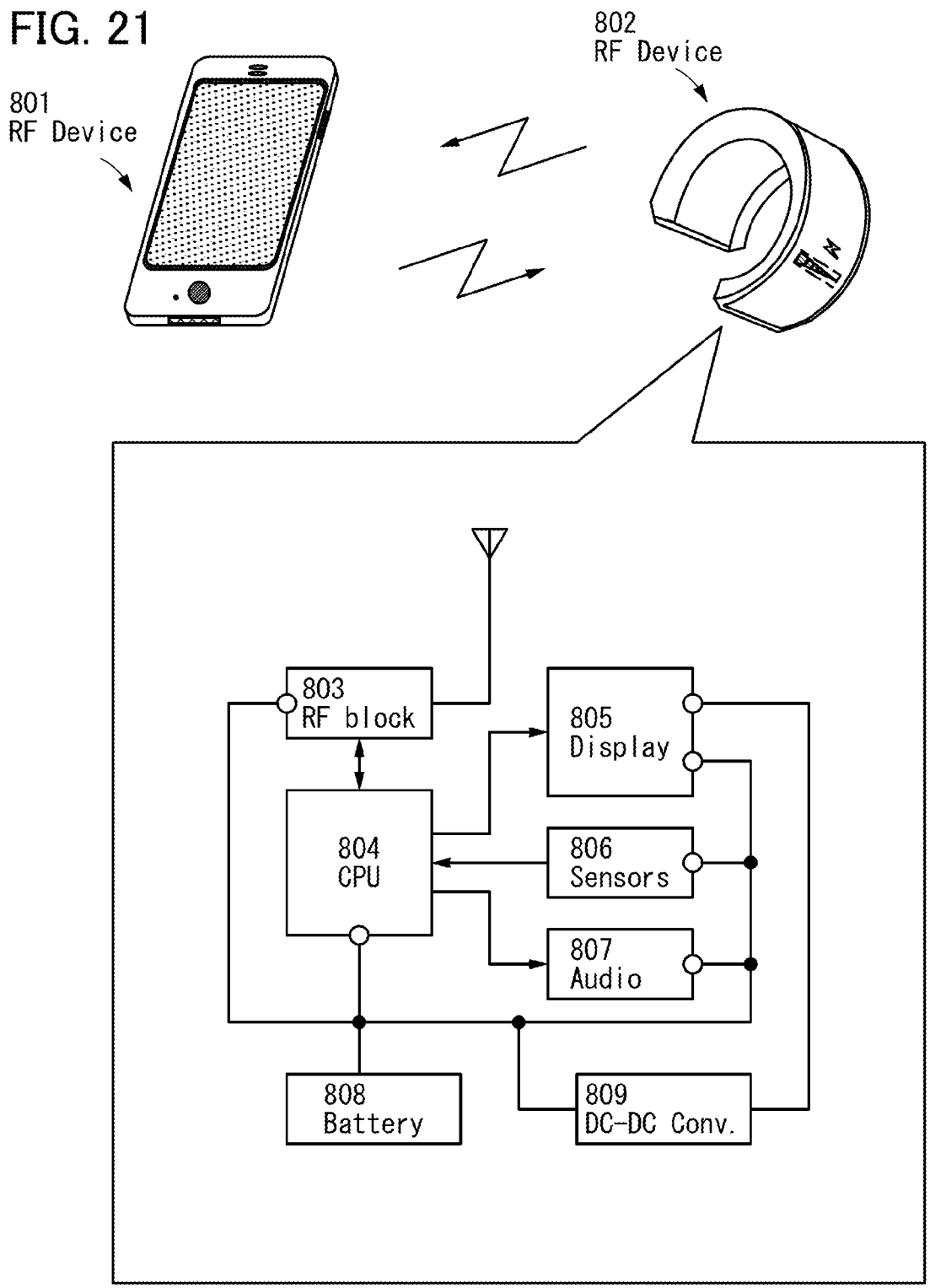

SIGNAL PROCESSING DEVICE, AND DRIVING METHOD AND PROGRAM THEREOF

BACKGROUND OF THE INVENTION

1. Field of the Invention

The present invention relates to a signal processing device.

2. Description of the Related Art

An analog amplifier circuit, a high-frequency amplifier circuit, and the like require one or more bias potentials to stably operate. Such a bias potential is obtained by supplying a current to a plurality of two-terminal elements; thus, a current is constantly consumed in operation (see Patent Document 1).

REFERENCE

[Patent Document 1] U.S. Pat. No. 5,493,255
[Patent Document 2] U.S. Pat. No. 8,467,825
[Patent Document 3] United States Patent Application Publication No. 2013/0271220

SUMMARY OF THE INVENTION

An object is to reduce power consumption of a signal processing circuit. Another object is to reduce the integration degree of a signal processing circuit. Another object is to provide a signal processing circuit having a novel structure. Another object is to provide a novel driving method of a signal processing circuit. Another object is to provide a novel semiconductor device.

Note that the descriptions of these objects do not disturb the existence of other objects. Note that not all the objects have to be achieved. Objects other than the above objects will be apparent from and can be derived from the descriptions of the specification, the drawings, the claims, and the like.

One embodiment of the present invention is a signal processing device including a first bias generation circuit, a potential holding portion, and an amplifier circuit. The potential holding portion includes a switch and a capacitor and holds charge accumulated in the capacitor by turning off the switch to cut connection between the capacitor and another circuit. A first potential held in the potential holding portion is supplied to the first bias generation circuit. The first bias generation circuit generates a second potential and a third potential. The second potential and the third potential on one of which an input signal is superimposed are input to the amplifier circuit.

In one embodiment, a bias potential is not obtained by a current but is held in the potential holding portion, which precludes the necessity of constantly consuming a current, leading to a reduction in power consumption. In the above embodiment or another embodiment, in the case where a bias potential is held in the potential holding portion for a sufficiently long period of time, a circuit for generating a bias potential is unnecessary, which contributes to higher integration. Note that the details of other effects in the above embodiment or another embodiment will be described separately.

BRIEF DESCRIPTION OF THE DRAWINGS

In the accompanying drawings:

FIGS. 13A to 13C are block diagrams illustrating an example of a system of a signal processing device;

FIG. 21 illustrates a communication system between electronic devices.

DETAILED DESCRIPTION OF THE INVENTION

Figure 1:
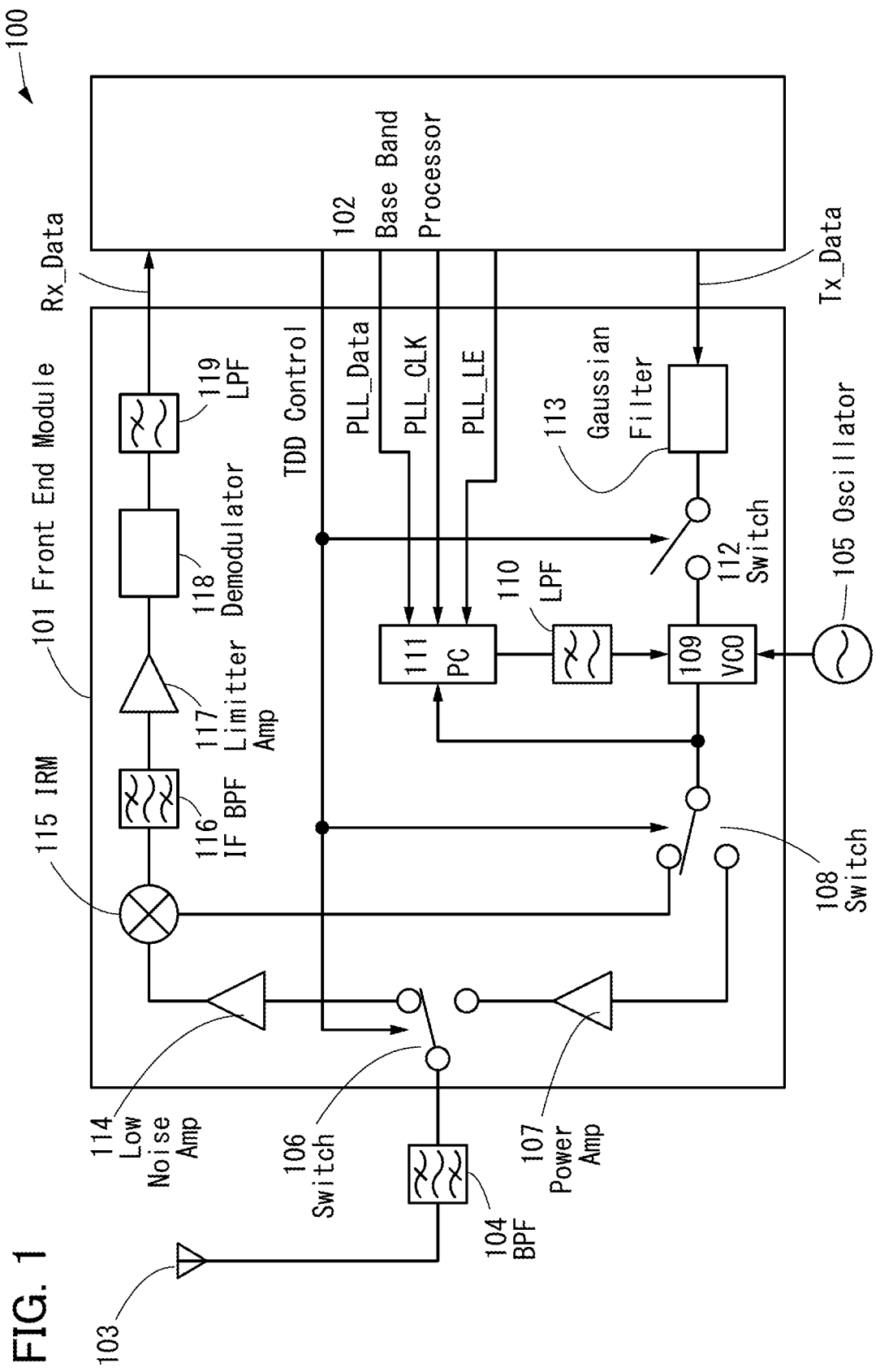
FIG. 1 illustrates an example of a signal processing device including an RF front end module.

Hereinafter, embodiments will be described with reference to drawings. Note that embodiments can be carried out in many different modes, and it is easily understood by those skilled in the art that modes and details of the present invention can be modified in various ways without departing from the spirit and scope of the present invention. Therefore, the present invention should not be construed as being limited to the following descriptions of the embodiments. Note that, in the structures of the present invention described below, identical objects in all the drawings are denoted by the same reference numerals.

In the drawings, the size, the layer thickness, or the region is exaggerated for clarity in some cases. Therefore, embodiments of the present invention are not limited to such a scale. Note that drawings are schematic views of ideal examples, and the embodiments of the present invention are not limited to the shape or the value illustrated in the drawings. For example, variation in signal, voltage, or current due to noise or a difference in timing can be included.

In this specification and the like, a transistor is an element having at least three terminals: a gate, a drain, and a source. The transistor has a channel region between a drain (a drain terminal, a drain region, or a drain electrode) and a source (a source terminal, a source region, or a source electrode), and current can flow through the drain, the channel region, and the source.

In this specification and the like, ordinal numbers such as "first," "second," and "third" are used to avoid confusion among components, and thus do not limit the number of the components.

In this specification and the like, terms for describing arrangement, such as "over" and "under," are used for convenience to describe the positional relation between components with reference to drawings. The positional relation between components is changed as appropriate in accordance with the direction in which each component is described. Thus, there is no limitation on terms used in this specification, and description can be made appropriately depending on the situation.

In this specification and the like, the positional relation of circuit blocks in diagrams are specified for description, and even in the case where different circuit blocks have different functions in the diagrams, the different circuit blocks may be provided in an actual circuit or region so that different functions are achieved in the same circuit or region. In addition, the functions of circuit blocks in diagrams are specified for description, and even in the case where one circuit block is illustrated, blocks may be provided in an actual circuit or region so that processing performed by one circuit block is performed by a plurality of circuit blocks.

Embodiment 1

FIG. 1 illustrates a part of a circuit of a signal processing device 100 of a mobile phone or the like. The circuit is provided with a front end module 101, a base band processor 102, an antenna 103, a band-pass filter 104, an oscillator 105, and the like.

Signals received by the antenna 103 are sorted by the band pass filter 104 and then amplified by a low noise amplifier 114. Furthermore, an image reduction mixer 115 mixes the amplified signals with a high frequency wave generated by a voltage control oscillator 109. After that, an intermediate frequency (IF) component is extracted through an IF band-pass filter 116, is amplified by a limiter amplifier 117, and is sent as received data Rx_Data to the base band processor 102 through a demodulator 118 and a low pass filter 119.

Meanwhile, noise of sent data Tx_Data sent to the front end module 101 from the base band processor 102 is removed by a Gaussian filter 113, and then, frequency modulation is performed by the voltage control oscillator 109 to turn Tx_Data into a high-frequency signal. This signal is amplified by a power amplifier 107 and is radiated by the antenna 103 through the band-pass filter 104.

Here, a switch 106, a switch 108, and a switch 112 are controlled by a time division duplex (TDD) control signal (denoted by TDD Control in the drawing) and switch between transmission and reception of the front end module 101. In addition, a phase locked loop (PLL), in which part of a high frequency wave output from the voltage control oscillator 109 passes through a phase comparison circuit 111 and a low pass filter 110 and is returned to the voltage control oscillator 109, is formed, so that frequency stabilizes. The phase comparison circuit 111 is controlled by signals (denoted by PLL_Data, PLL_CLK, and PLL_LE) supplied from the base band processor 102.

In the above circuit, the base band processor 102 is a portion that performs digital processing. Although power consumption of the base band processor 102 is reduced with miniaturization, power consumption of the front end module 101, which performs analog processing, is not easily and not sufficiently reduced. One of the reasons is that a variety of amplifiers (e.g., the power amplifier 107 and the low noise amplifier 114) used in the front end module 101 require a bias generation circuit.

Figure 2:
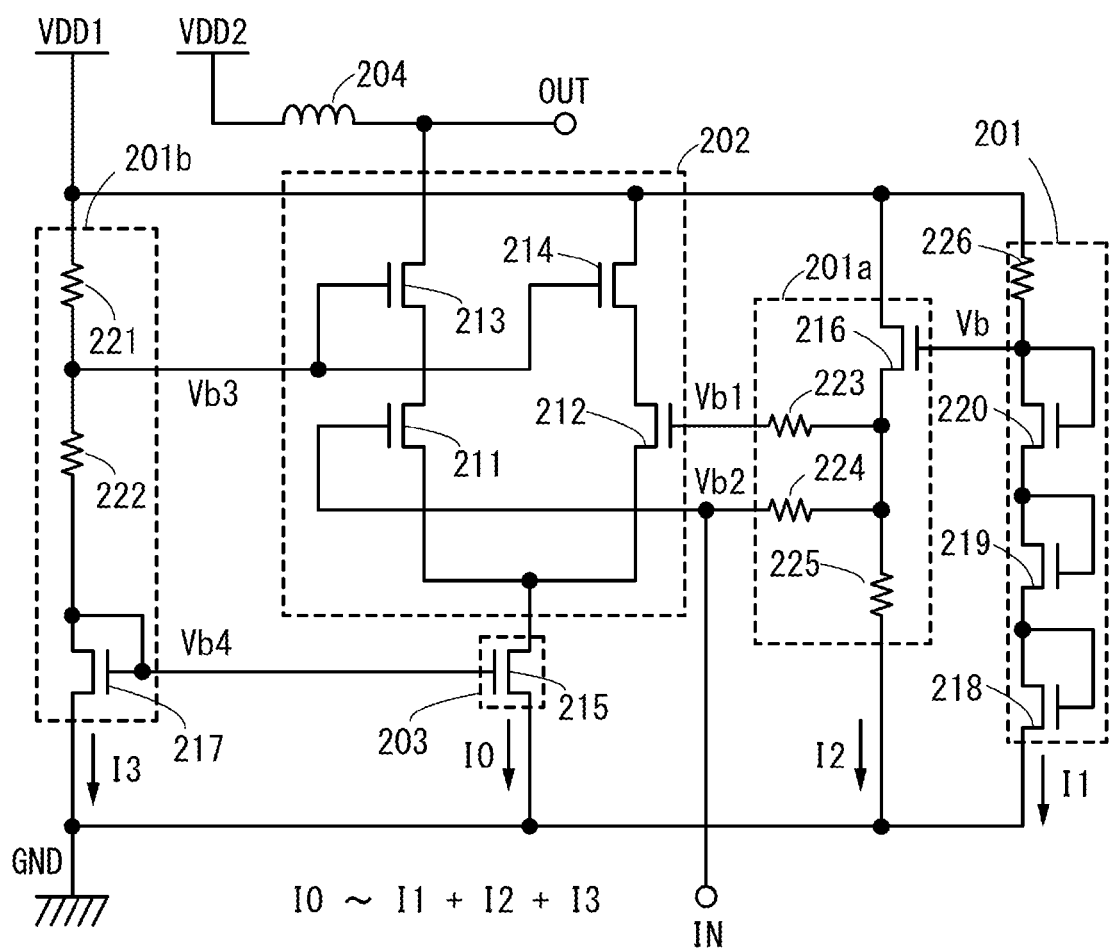
FIG. 2 illustrates an example of a signal processing device.

FIG. 2 illustrates an example of such an amplifier. The amplifier is a complicated circuit including a plurality of transistors and a resistor but can be divided into the following blocks and elements according to their functions: an amplifier circuit 202, a bias generation circuit 201, a bias generation circuit 201a, a bias generation circuit 201b, a constant current generation circuit 203, and an inductor 204.

For example, the amplifier circuit 202 includes a differential amplifier portion including a transistor 211 and a transistor 212, and a transistor 213 and a transistor 214 that function as cascode transistors. The transistors 213 and 214 are provided to prevent capacitive coupling between the inductor 204 and the differential amplifier portion including the transistors 211 and 212.

The bias generation circuit 201 includes a diode-connected transistor 218, a diode-connected transistor 219, a diode-connected transistor 220, and a resistor 226 and is configured such that a bias potential Vb is output from a connecting point between a drain of the transistor 220 and the resistor 226. Thus, the bias potential Vb is higher than a ground potential GND by the sum of the thresholds of the transistors 218 to 220.

Similarly, the bias generation circuit 201b includes a diode-connected transistor 217, a resistor 221, and a resistor 222 and is configured such that a bias potential Vb3 is output from a connecting point between the resistor 221 and the resistor 222 and a bias potential Vb4 is output from a connecting point between a drain of the transistor 217 and the resistor 222. Here, it is found that the bias potential Vb4 is higher than the ground potential GND by the threshold of the transistor 217. The bias potential Vb3 is obtained by dividing the value obtained by subtracting the ground potential GND and the threshold of the transistor 217 from a potential VDD by the resistance values of the resistors 221 and 222.

The bias generation circuit 201a includes a transistor 216, a resistor 223, a resistor 224, and a resistor 225 and outputs a bias potential Vb1 and a bias potential Vb2. In the case where an input signal IN is not taken into consideration, the bias potential Vb1 is equal to the bias potential Vb2; specifically, the bias potentials Vb1 and Vb2 are lower than the bias potential Vb by the threshold of the transistor 216.

The constant current generation circuit 203 may be most simply formed using a MOS transistor that operates in a saturation region, here a transistor 215. Here, since the transistor 215 needs to operate in a saturation region, the potential of a drain of the transistor 215 is required to be higher than or equal to the potential of a gate of the transistor 215 (i.e., the bias potential Vb4). The bias potential Vb1 and the bias potential Vb2 are determined in view of the above.

For example, in the case where the thresholds of the transistors 211 to 220 in FIG. 2 are all Vth, the following are satisfied: $Vb=3 \times Vth+GND$; $Vb1=Vb2=2 \times Vth+GND$; and $Vb4=Vth+GND$. Furthermore, the potential of a source of the transistor 211 (or a source of the transistor 212) (i.e., the potential of the drain of the transistor 215) is Vth+GND, which is lower than the bias potential Vb1/the bias potential Vb2 by Vth; accordingly, the transistor 215 operates in a saturation region.

Although the case of not considering the input signal IN is described above, when the input signal IN, which is a high frequency signal, is superimposed on Vb2, a difference is generated between the potential of a gate of the transistor 211 and the potential of a gate of the transistor 212 and is amplified.

As described above, the amplifier includes three bias generation circuits, and each bias generation circuit generates a bias potential when a current is supplied between the potential VDD and the ground potential GND. For example, in the case where currents flowing through the bias generation circuit 201, the bias generation circuit 201a, and the bias generation circuit 201b are a current I1, a current I2, and a current I3, respectively, these currents are determined by the channel lengths and the channel widths of the transistors included in the respective bias generation circuits. For example, in the case where the transistors 216 to 220 included in the bias generation circuits all have the same size and VDD≥3×Vth+GND is satisfied, the current I1, the current I2, and the current I3 are equal to each other. Furthermore, in the case where the transistor 215 has the same size as the transistors 216 to 220, a current I0 flowing through the transistor 215 is also equal to the current I1, the current I2, and the current I3.

For example, when the channel lengths of the transistors 216 to 220 are extremely long, the sum of the currents I1, I2, and I3 can be significantly smaller than the current I0; however, the area of a region occupied by the transistors 216 to 220 is increased, which hinders integration. Thus, in general, the sum of the currents I1, I2, and I3 is approximately equivalent to the current I0. For this reason, reducing a current consumed by the bias generation circuits leads to a reduction in power consumption of the amplifier.

A circuit capable of holding a bias potential (potential holding circuit) precludes the necessity of constantly supplying a current to the bias generation circuit. Such a potential holding circuit can be formed by a combination of a capacitor and a switch. In particular, a switch that can be regarded as having substantially no conductivity in an off state can hold charge of a capacitor for a sufficiently long period of time.

Although a transistor using an oxide semiconductor (see Patent Document 2 and Patent Document 3) is suitable for the switch, any of the other transistors or a mechanical switch (micromachine switch) may be used.

For example, a potential holding circuit where the capacitance of a capacitor is 1 fF and the off resistance of a switch is $1 \times 10^{13} \Omega$ requires 1 millisecond for the initial potential to be changed by 10%. In this case, charge is preferably injected into the capacitor of the potential holding circuit every 1 millisecond, for example.

For example, a potential holding circuit where the capacitance of a capacitor is 1 fF and the off resistance of a switch is $1 \times 10^{22} \Omega$ requires approximately 12 days for the initial potential to be changed by 10%. In this case, charge is preferably injected into the capacitor of the potential holding circuit every 12 days, for example.

A capacitor with larger capacitance can hold charge for a longer period of time. Thus, for example, when charge is injected into a potential holding circuit prior to shipment, operation can be performed for a quality assurance period (e.g., for two years) even without supplying charge to the potential holding circuit after shipment. In such a case, it is not necessary to provide a bias generation circuit, which is advantageous to circuit integration.

Figure 3A:
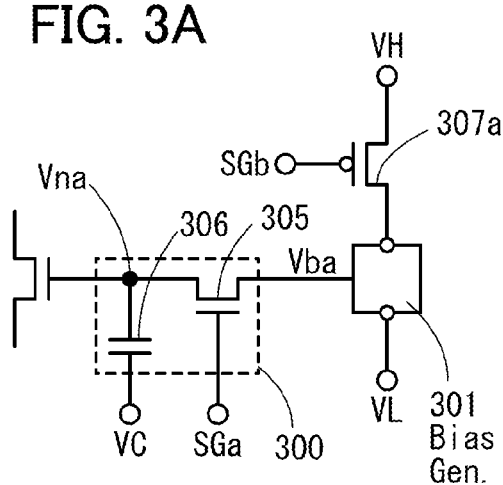
FIGS. 3A to 3D are block diagrams each illustrating an example of a signal processing device.

FIG. 3A illustrates an example of a circuit that holds a potential generated by a bias generation circuit 301, in a potential holding circuit 300. The potential holding circuit 300 includes a switch 305 and a capacitor 306. Note that it is possible that the capacitor 306 is not a component intentionally provided (the capacitor 306 may be parasitic capacitance, for example). On/off of the switch 305 is controlled by a control signal SGa. The switch 305 is provided so as to control connection between an output terminal of the bias generation circuit 301 and one electrode of the capacitor 306.

The one electrode of the capacitor 306 is connected to an input terminal of another circuit (in many cases, a gate of a transistor) and is substantially in a floating state when the switch 305 is off. Note that an electrode of the capacitor 306 that is connected to the switch 305 is referred to as a first electrode. The other electrode of the capacitor 306 (referred to as a second electrode) is held at a potential VC. Note that the potential VC may be equal to or different from the potential VH or the potential VL.

The capacitor 306 may be formed of a MOS capacitor as illustrated in FIGS. 4A to 4D. Furthermore, an oxide semiconductor may be used as a semiconductor of the MOS capacitor. Alternatively, a semiconductor whose conductivity is increased by making the semiconductor have n-type or p-type conductivity by doping or the like may be used. In the case of using an oxide semiconductor as the semiconductor, the conductivity may be increased by introducing hydrogen into the oxide semiconductor or bringing the oxide semiconductor and silicon nitride into contact with each other so that the oxide semiconductor becomes n-type. The use of an oxide semiconductor that has become n-type can improve reliability.

The bias generation circuit 301 is supplied with the high potential VH and the low potential VL and generates the bias potential Vb. A power switch 307a is provided between the high potential VH and the bias generation circuit 301 so that power supply to the bias generation circuit 301 can be controlled. The power switch 307a may be a transistor or a mechanical switch. The power switch 307a is a p-channel transistor in the drawing but may be an n-channel transistor. On/off of the power switch 307a is controlled by a control signal SGb.

Figure 3B:
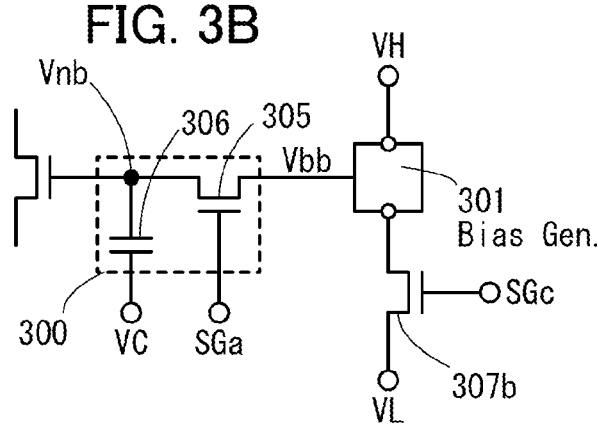

FIG. 3B illustrates another example, which is different from the example in FIG. 3A in that a power switch 307b is provided between the low potential VL and the bias generation circuit 301 so that power supply to the bias generation circuit 301 can be controlled. The power switch 307b may be a transistor or a mechanical switch. The power switch 307b is an n-channel transistor in the drawing but may be a p-channel transistor. On/off of the power switch 307b is controlled by a control signal SGc.

Note that both the power switches 307a and 307b may be provided, for example. In that case, power consumption can be further reduced.

The power switch interrupts a current flowing through the bias generation circuit 301. Therefore, the power switch may be provided between a wiring to which the high potential VH is supplied and the bias generation circuit 301, between a wiring to which the low potential VL is supplied and the bias generation circuit 301, or in the bias generation circuit 301. Alternatively, the power switches may be provided both inside and outside the bias generation circuit 301.

Figure 5A:
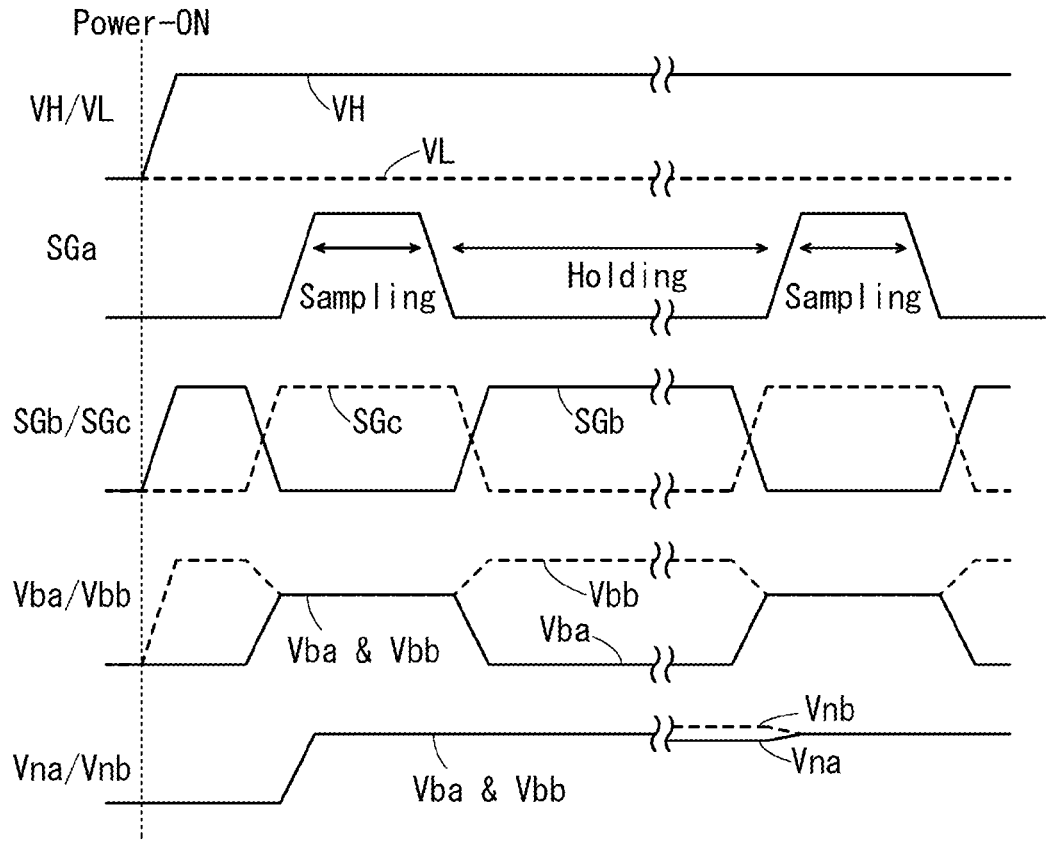
FIGS. 5A and 5B are block diagrams each showing an example of a driving method of a signal processing device.

An operation example of such a circuit will be described with reference to FIG. 5A. In the drawing, symbols VH, VL, SGa, SGb, and SGc denote the high potential VH, the low potential VL, and the potentials of the control signal SGa, the control signal SGb, and the control signal SGc, respectively. Symbols Vba and Vbb denote the potential of the output terminal of the bias generation circuit 301 in the circuit of FIG. 3A and the potential of the output terminal of the bias generation circuit 301 in the circuit of FIG. 3B, respectively. Symbols Vna and Vnb denote the potential of the first electrode of the capacitor 306 in the circuit of FIG. 3A and the potential of the first electrode of the capacitor 306 in the circuit of FIG. 3B, respectively.

Immediately after the power of the signal processing device having the circuit in FIG. 3A (or FIG. 3B) is turned on, the power switch 307a (or the power switch 307b) is off. Thus, the bias generation circuit 301 outputs a potential different from the bias potential Vb to be output. For example, in the circuit illustrated in FIG. 3A, the power switch 307a on the high potential side is off; thus, the bias generation circuit 301 outputs a potential equal to the potential VL as the potential Vba. In the circuit illustrated in FIG. 3B, the power switch 307b on the low potential side is off; thus, the bias generation circuit 301 outputs a potential equal to the potential VH as the potential Vbb.

After that, the power switch 307a (or the power switch 307b) is turned on by the control signal SGb (or the control signal SGc), so that the potential of the output terminal of the bias generation circuit 301 becomes the bias potential Vb to be output. Then, the switch 305 is turned on by the control signal SGa and the capacitor 306 is charged. The above operation is called sampling and denoted by Sampling in the drawings.

When the charging of the capacitor is finished, the switch 305 is turned off by the control signal SGa and charge in the capacitor 306 is held. In addition, the power switch 307a (or the power switch 307b) is turned off by the control signal SGb (or the control signal SGc). Accordingly, the potential Vba (or the potential Vbb) of the output terminal of the bias generation circuit 301 is different from the bias potential Vb. However, since the switch 305 is off, the potential Vna (or the potential Vnb) is unlikely to be affected. The above operation is called holding and denoted by Holding in the drawings.

After a certain period passes, the potential Vna (or the potential Vnb) is changed from the value just after sampling. In the circuit of FIG. 3A, the potential of the output terminal of the bias generation circuit 301 is VL; thus, the potential Vna decreases from the value just after sampling. On the other hand, in the circuit of FIG. 3B, the potential of the output terminal of the bias generation circuit 301 is VH; thus, the potential Vnb increases from the value just after sampling.

Here, sampling is performed again. In order to perform sampling, the power switch 307a (or the power switch 307b) is turned on by the control signal SGb (or the control signal SGc). The potential of the output terminal of the bias generation circuit 301 becomes the bias potential Vb to be output. Then, the switch 305 is turned on by the control signal SGa and the capacitor 306 is charged at the potential Vb. In this manner, the bias generation circuit 301 can be operated only when necessary, leading to a reduction in power consumption.

Note that in the above operation, the bias potential Vb is higher than the low potential VL. Meanwhile, the potential of a control signal for turning off the switch 305 can be, for example, VL. In that case, when the switch 305 is an n-channel transistor, the potential of a gate is lower than the potential of a source or a drain in the circuit illustrated in FIG. 3B. When the switch 305 is a transistor using an oxide semiconductor (OS transistor), the potential of its source or its drain is preferably set to higher than the potential of its gate by 0.5 V or more, typically 1 V or more, in which case the off resistance can be increased.

Figure 5B:
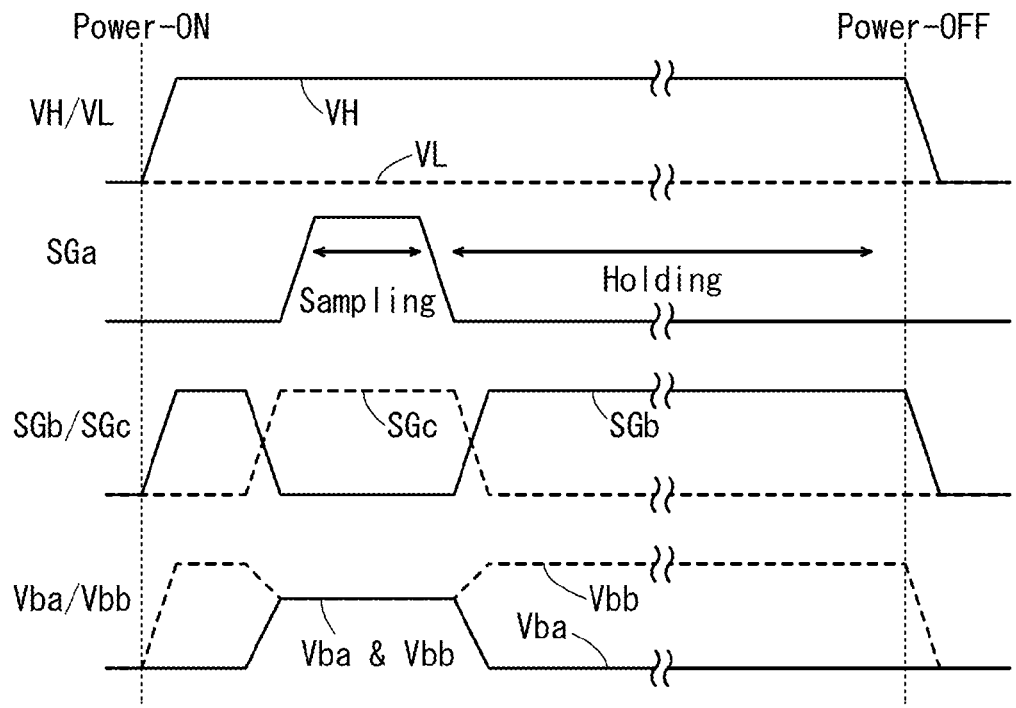

FIG. 5B illustrates another operation example. In this example, after the power of the signal processing device is turned on, sampling is automatically performed only once and sampling is not performed after that until the power is turned off. Sufficiently excellent holding characteristics of the potential holding circuit 300 enable such a driving method.

Next, an example of the bias generation circuit 301 will be described with reference to FIGS. 6A to 6E. The bias generation circuit is a circuit for providing a target potential (bias potential) when a high potential and a low potential are input from the outside so that a current flows.

Figure 6A:
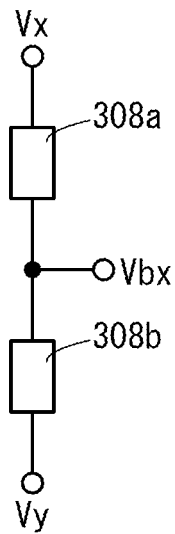
FIGS. 6A to 6E each illustrate an example of a bias potential generation circuit.

Examples of the bias generation circuit include a circuit where a two-terminal element 308a and a two-terminal element 308b are serially connected between a potential Vx and a potential Vy so that a bias potential Vbx can be obtained from a connecting point between the two-terminal element 308a and the two-terminal element 308b like in a circuit illustrated in FIG. 6A. Note that one of Vx and Vy is higher than the other in the following description. The two-terminal element refers to a resistor, a capacitor, an inductor, a forward or backward diode (including a diode-connected transistor), or the like.

Further adding a two-terminal element allows two or more different bias potentials to be obtained. For example, as in the circuit illustrated in FIG. 6B, the circuit illustrated in FIG. 6A and a two-terminal element 308c are serially connected between the potential Vx and the potential Vy so that the bias potential Vbx can be obtained from a connecting point between the two-terminal element 308a and the two-terminal element 308b and a bias potential Vby can be obtained from a connecting point between the two-terminal element 308b and the two-terminal element 308c. In a similar manner, a bias generation circuit that can output more bias potentials can be formed.

Although the power switches 307a and 307b are provided outside the bias generation circuit in FIGS. 3A and 3B, the positions of the switches 307a and 307b are not limited to these examples. For example, FIGS. 7A and 7B each illustrate a case where the power switch 307c is provided in the bias generation circuit illustrated in FIG. 6A. Similarly, FIGS. 7C to 7F each illustrate a case where the power switch 307c is provided in the bias generation circuit illustrated in FIG. 6B. Providing the power switches in series between elements enables interruption of a current flowing between the elements, leading to a reduction in power consumption.

Note that any or all of the two-terminal elements of the bias generation circuit may be replaced with transistors. For example, when the two-terminal element 308a of the bias generation circuit illustrated in FIG. 6A is replaced with a transistor 309, a circuit illustrated in FIG. 6C is obtained. Here, a specific potential Vin is input to a gate of the transistor 309, whereby the potential Vbx can be determined.

Figure 6B:
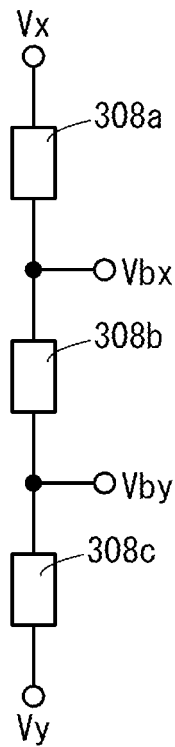
Figure 6C:
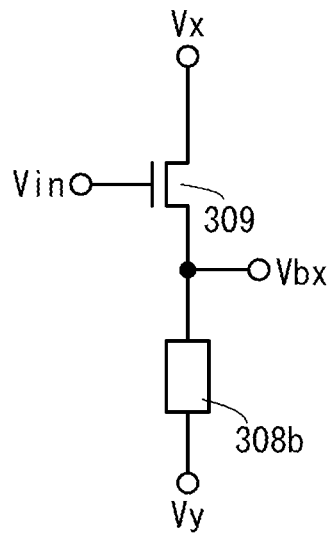
Figure 6D:
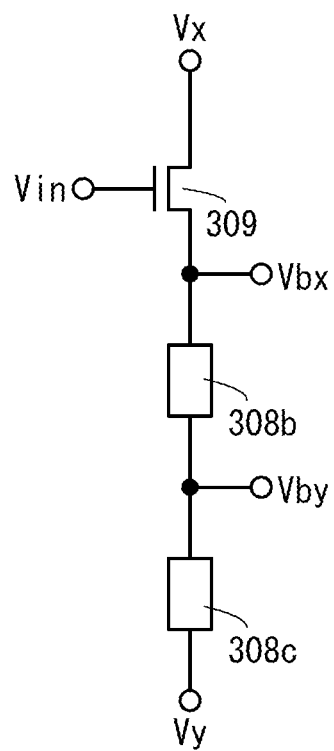
Figure 6E:
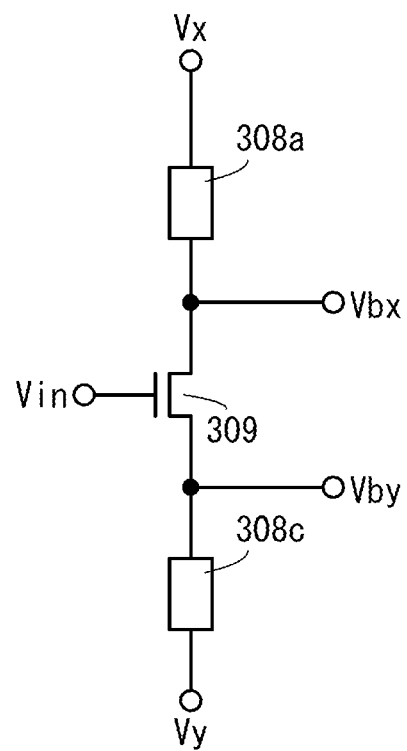
Figure 7A:
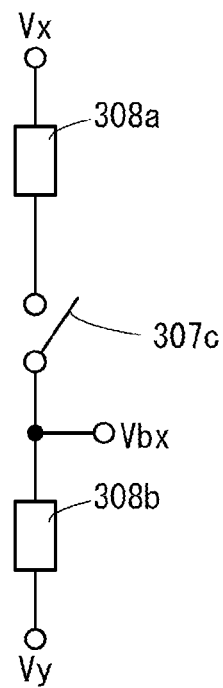
FIGS. 7A to 7F each illustrate an example of a bias potential generation circuit.
Figure 7B:
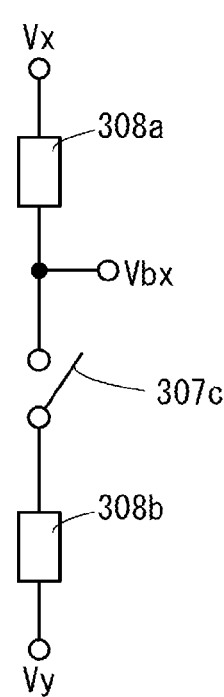
Figure 7C:
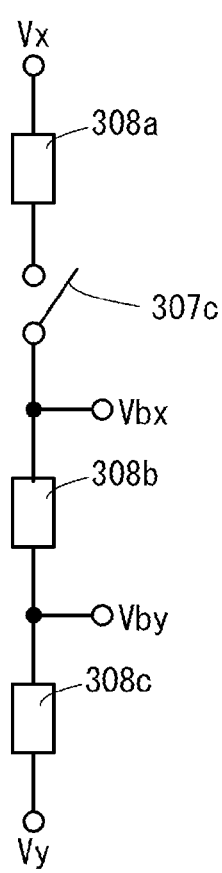
Figure 7D:
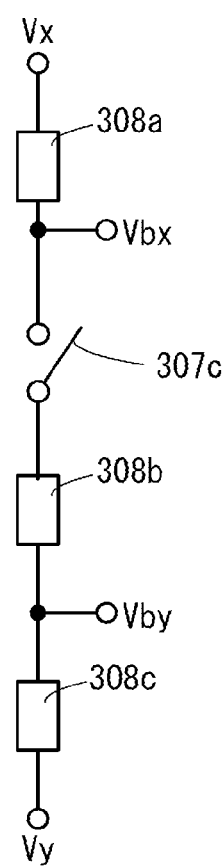
Figure 7E:
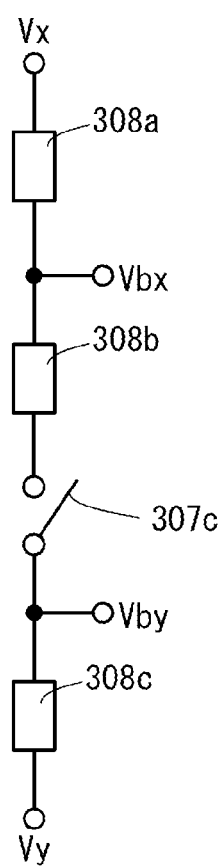
Figure 7F:
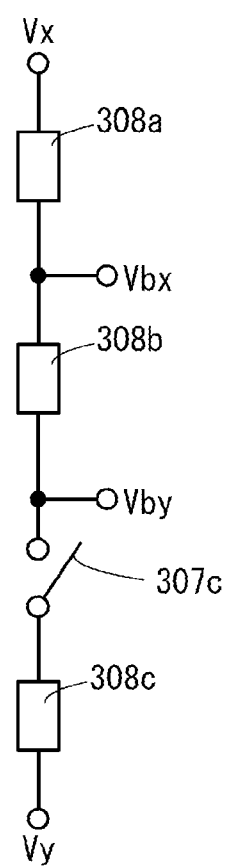

In a similar manner, when the two-terminal element 308a of the bias generation circuit illustrated in FIG. 6B is replaced with the transistor 309, a circuit illustrated in FIG. 6D is obtained. When the two-terminal element 308b of the bias generation circuit illustrated in FIG. 6B is replaced with the transistor 309, a circuit illustrated in FIG. 6E is obtained.

As described above, there are a lot of variations of bias generation circuits, and depending on a combination of the above bias generation circuits, a more complicated bias generation circuit can be formed. The bias generation circuits 301 illustrated in FIGS. 3A to 3D may have a structure other than the structures illustrated in FIGS. 6A to 6E.

Figure 3C:
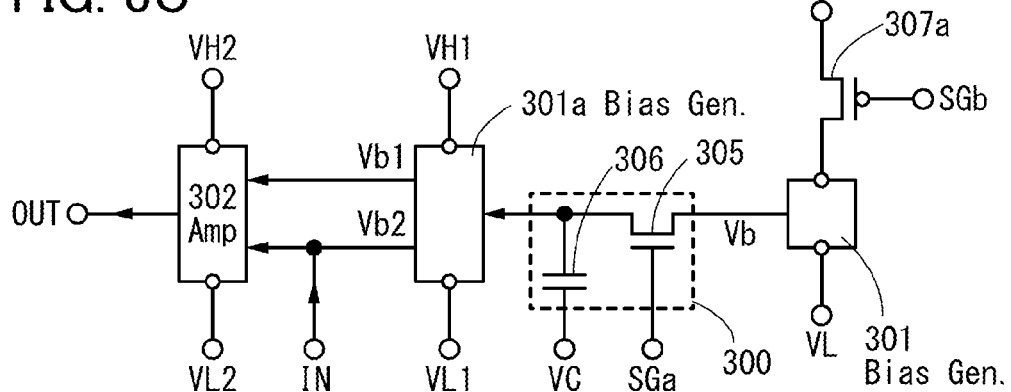

A circuit illustrated in FIG. 3C is an example of a signal processing device including the potential holding circuit 300. Here, two bias generation circuits (the bias generation circuit 301 and a bias generation circuit 301a) are provided. The bias potential Vb generated in the bias generation circuit 301 is held in the potential holding circuit 300 and is input to the bias generation circuit 301a having any of the structures including transistors shown in FIGS. 6C to 6E.

The bias potential Vb1 and the bias potential Vb2 are output from the bias generation circuit 301a and are input to the amplifier circuit 302. Note that the input signal IN is superimposed on the bias potential Vb2 and the input signal IN is amplified by the amplifier circuit 302 to be an output signal OUT. The high potential VH and the low potential VL are supplied to the bias generation circuit 301. A high potential VH1 and a low potential VL1 are supplied to the bias generation circuit 301a. A high potential VH2 and a low potential VL2 are supplied to the amplifier circuit 302. The high potentials VH, VH1, and VH2 may be different from one another or two or more of them may be equal to each other. The low potentials VL, VL1, and VL2 may be different from one another or two or more of them may be equal to each other. Power supply to the bias generation circuit 301 is controlled by the power switch 307a provided between the high potential VH and the bias generation circuit 301.

In the circuit illustrated in FIG. 3C, the potential holding circuit 300, the bias generation circuit 301, and the power switch 307a have the same structures as those in FIG. 3A.

Figure 3D:
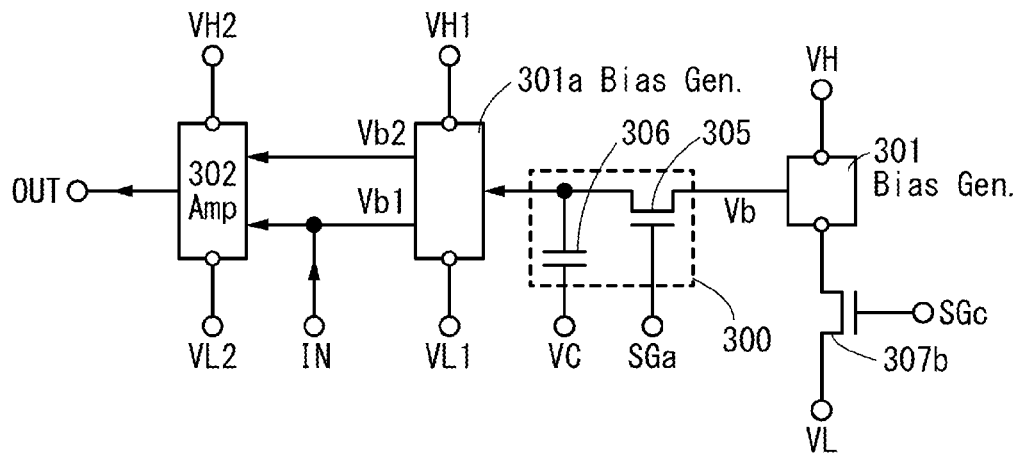
Figure 4A:
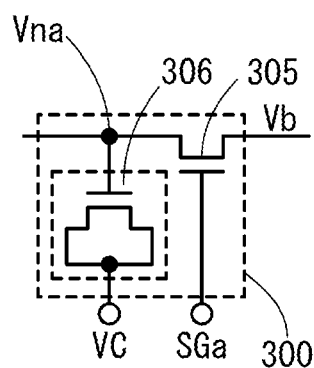
FIGS. 4A to 4D are circuit diagrams each illustrating an example of a semiconductor device.
Figure 4B:
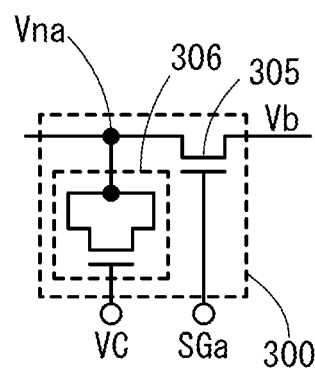
Figure 4C:
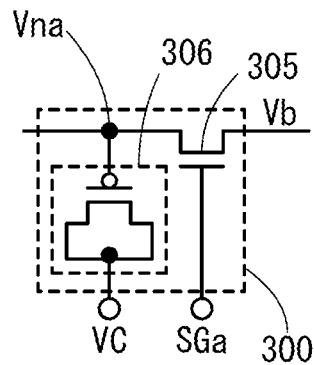
Figure 4D:
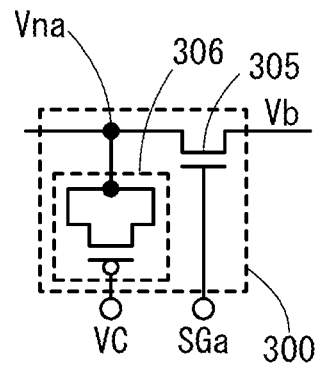

Alternatively, a power switch 307b may be provided between the low potential VL and the bias generation circuit 301 as in FIG. 3D. In that case, the potential holding circuit 300, the bias generation circuit 301, and the power switch 307b have the same structures as those in FIG. 3B.

Figure 8A:
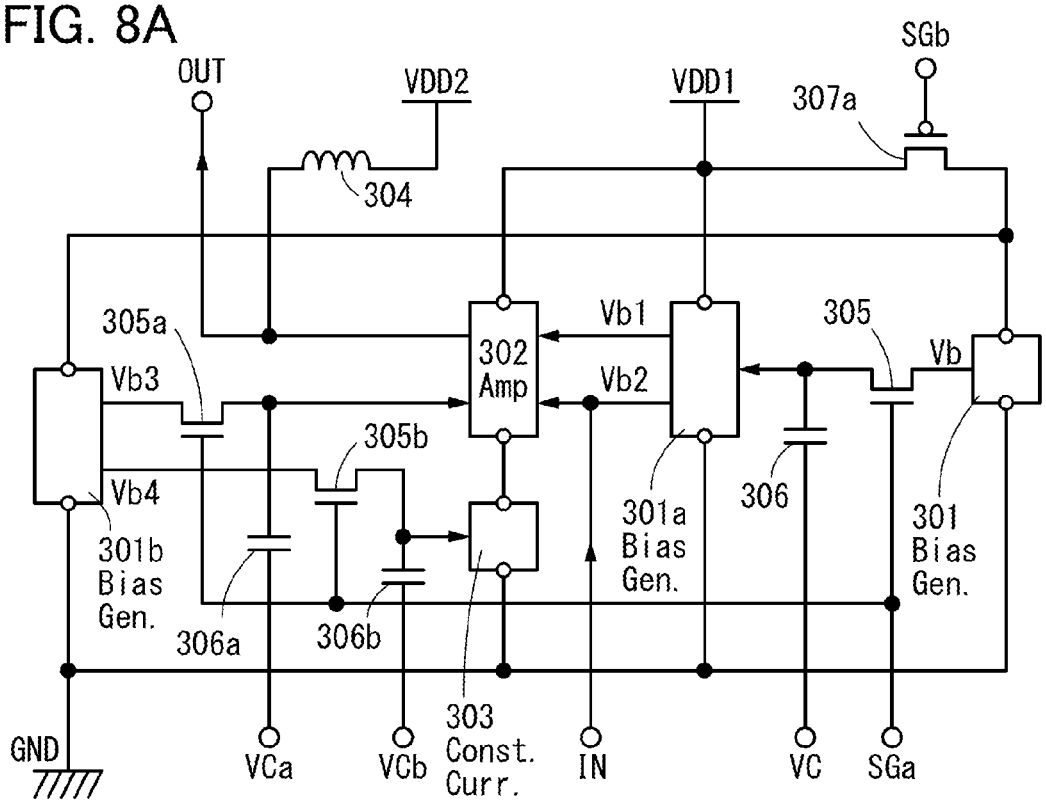
FIGS. 8A and 8B are block diagrams each illustrating an example of a signal processing device.

FIG. 8A illustrates an example of an amplifier including the amplifier circuit 302, a constant current generation circuit 303, and an inductor 304. A circuit illustrated in FIG. 8A includes the bias generation circuit 301, the bias generation circuit 301a, and a bias generation circuit 301b. The bias generation circuit 301 generates the bias potential Vb. The bias generation circuit 301a generates the bias potential Vb1 and the bias potential Vb2. The bias generation circuit 301b generates the bias potential Vb3 and the bias potential Vb4. The potential VDD1 and the ground potential GND are supplied to the bias generation circuits 301, 301a, and 301b. Note that supply of the potential VDD1 to the bias generation circuits 301 and 301b can be controlled by the power switch 307a.

In FIG. 8A, a potential holding circuit including the switch 305 and the capacitor 306 is configured to hold the bias potential Vb, a potential holding circuit including a switch 305a and a capacitor 306a is configured to hold the bias potential Vb3, and a potential holding circuit including a switch 305b and a capacitor 306b is configured to hold the bias potential Vb4. Note that it is assumed that the second electrodes of the capacitors 306a and 306b are held at a potential VCa and a potential VCb, respectively. All the switches 305, 305a, and 305b are controlled by the control signal SGa.

The potentials held in the potential holding circuits are supplied to another circuit. For example, the bias potential Vb held in the potential holding circuit including the switch 305 and the capacitor 306 is supplied to the bias generation circuit 301a; the bias potential Vb3 held in the potential holding circuit including the switch 305a and the capacitor 306a is supplied to the amplifier circuit 302; and the bias potential Vb4 held in the potential holding circuit including the switch 305b and the capacitor 306b is supplied to the constant current generation circuit 303.

Figure 9A:
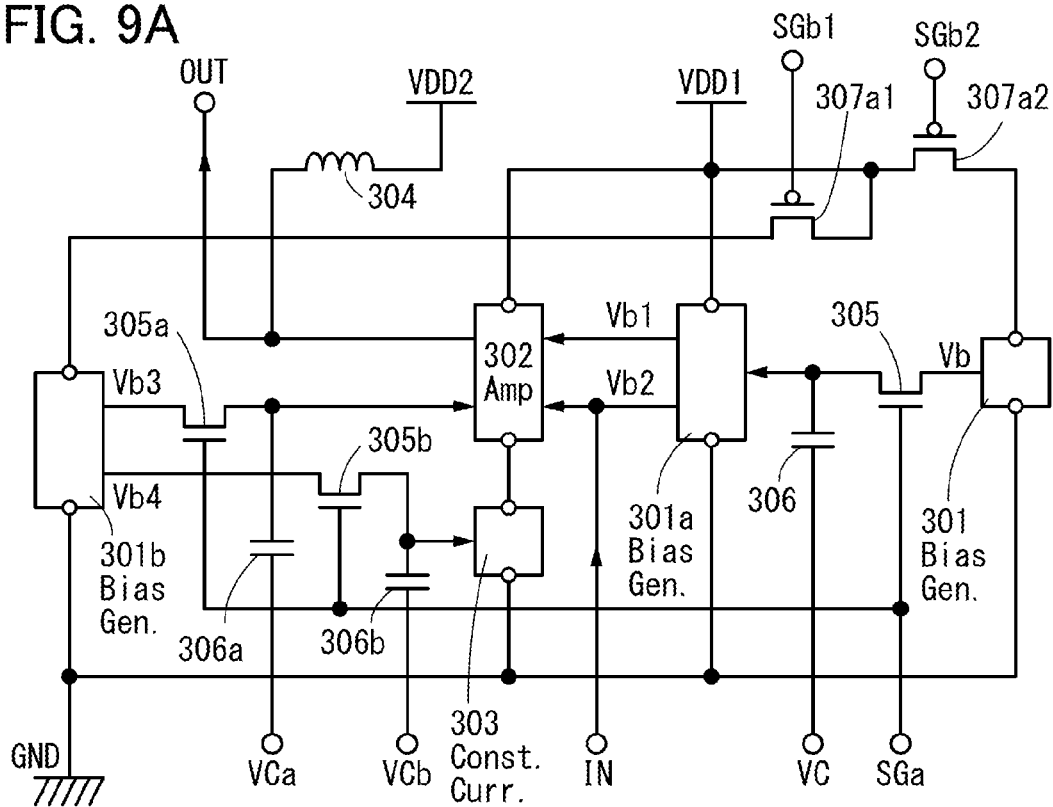
FIGS. 9A and 9B are block diagrams each illustrating an example of a signal processing device.

Note that the bias generation circuits 301 and 301b are controlled only by the power switch 307a but may be controlled individually. FIG. 9A illustrates the case where the bias generation circuits 301 and 301b are controlled by a power switch 307a2 and a power switch 307a1, respectively. The power switch 307a1 and the power switch 307a2 are controlled by a control signal SGb1 and a control signal SGb2, respectively.

Figure 8B:
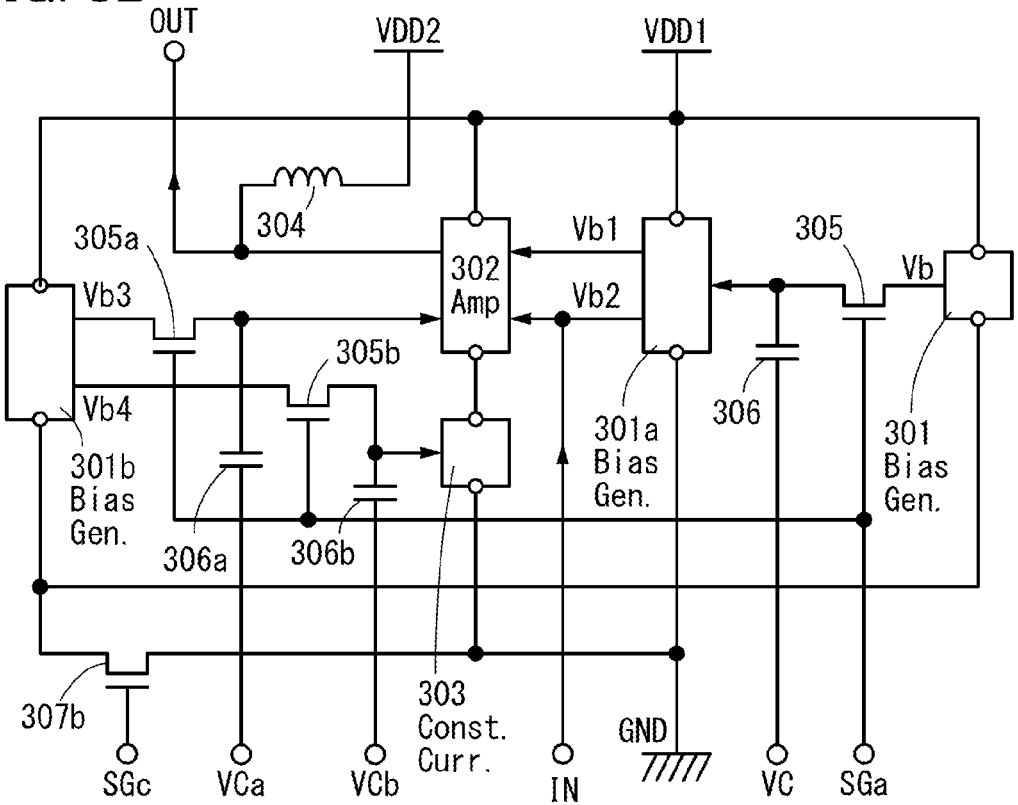

FIG. 8B illustrates an example of an amplifier including the amplifier circuit 302, the constant current generation circuit 303, and the inductor 304. The main structure is the same as that of the amplifier illustrated in FIG. 8A. Note that supply of the ground potential GND to the bias generation circuits 301 and 301b can be controlled by the power switch 307b.

Figure 9B:
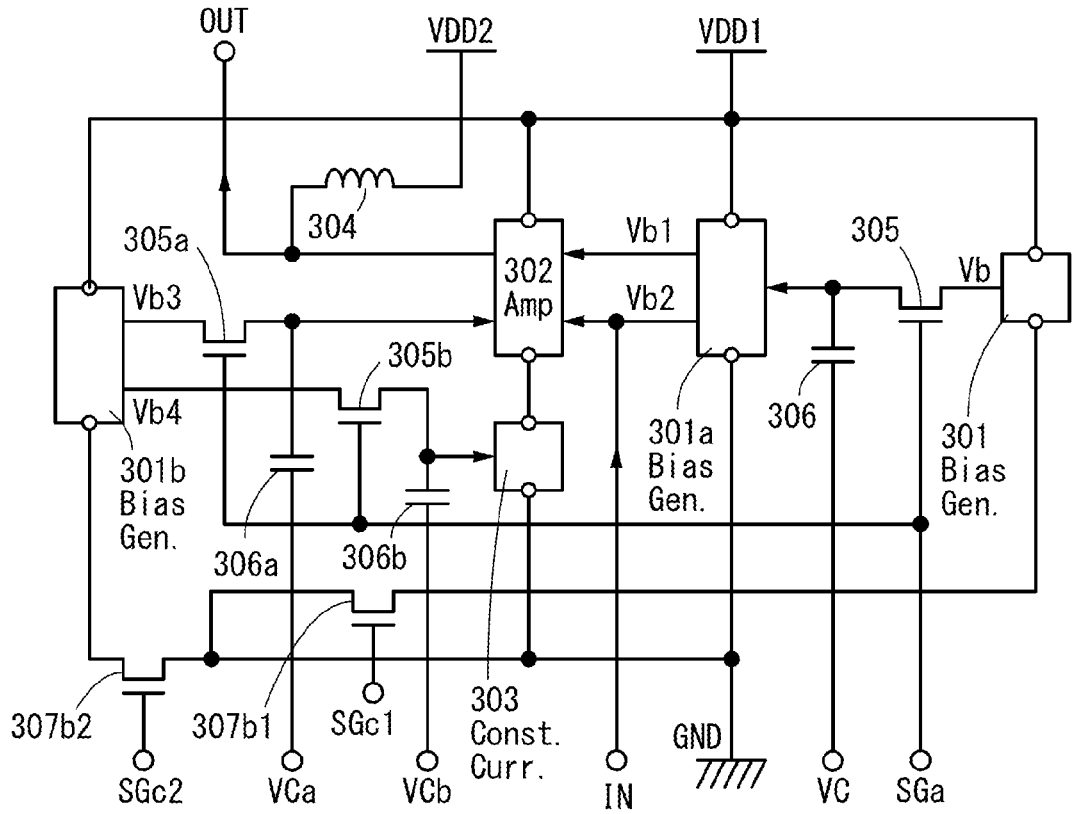

Note that the bias generation circuits 301 and 301b are controlled only by the power switch 307b but may be controlled individually. FIG. 9B illustrates the case where the bias generation circuits 301 and 301b are controlled by a power switch 307b1 and a power switch 307b2, respectively. The power switch 307b1 and the power switch 307b2 are controlled by a control signal SGc1 and a control signal SGc2, respectively.

In any of the cases, a current flowing through the bias generation circuits can be interrupted in a period when the bias potential is held in each potential holding circuit, by turning off the power switch 307a (or the power switch 307b). This can reduce power consumption. The power switch 307a can be controlled by the control signal SGb.

Figure 10A:
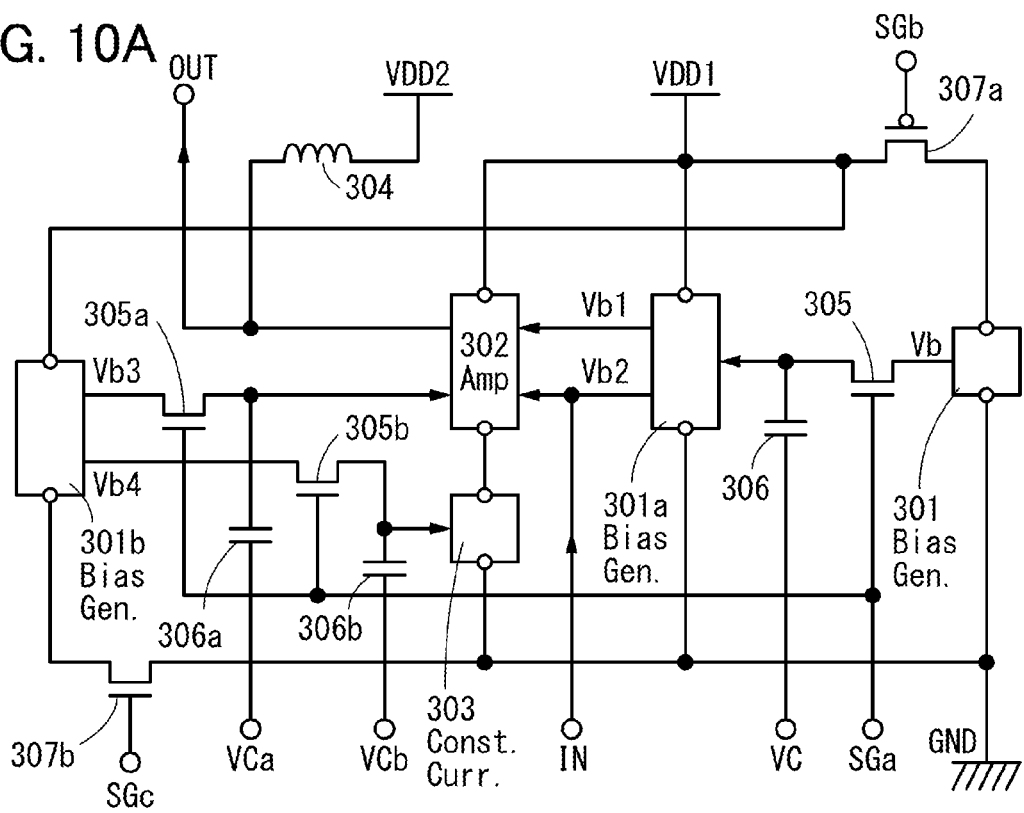
FIGS. 10A and 10B are block diagrams each illustrating an example of a signal processing device.
Figure 10B:
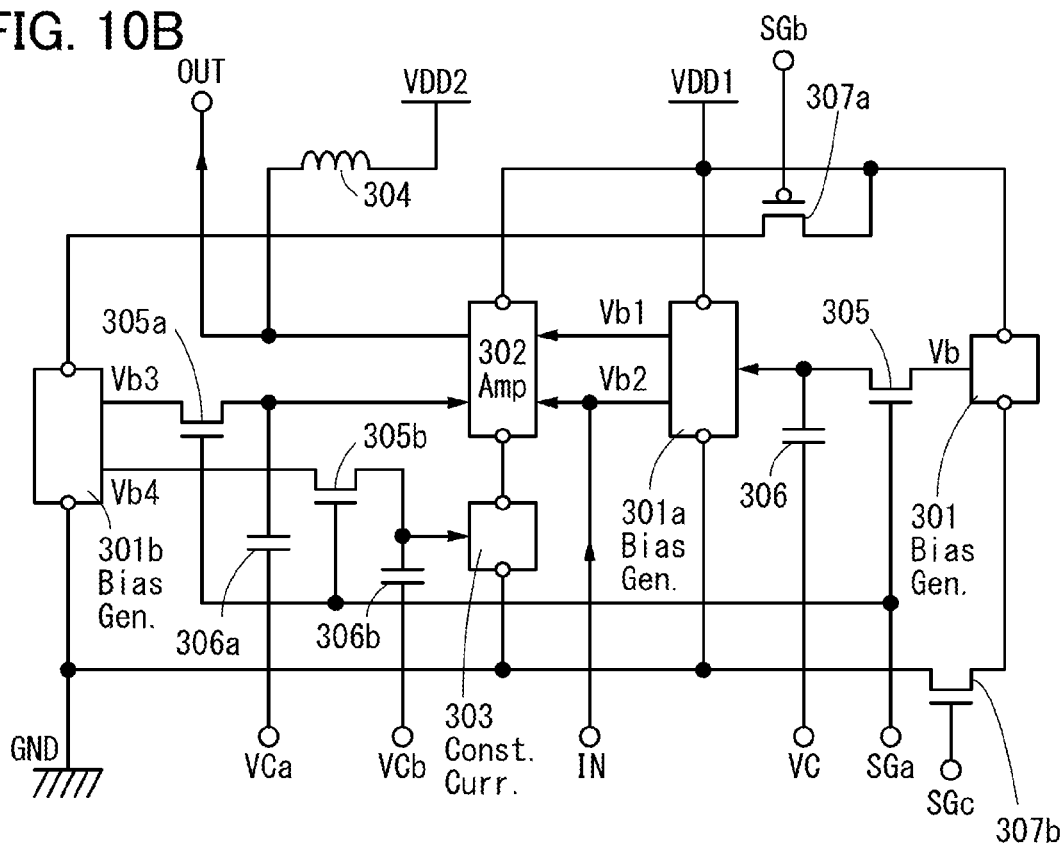

Note that the bias generation circuits 301 and 301b may be controlled by the power switches 307a and 307b as illustrated in FIGS. 10A and 10B.

Figure 11A:
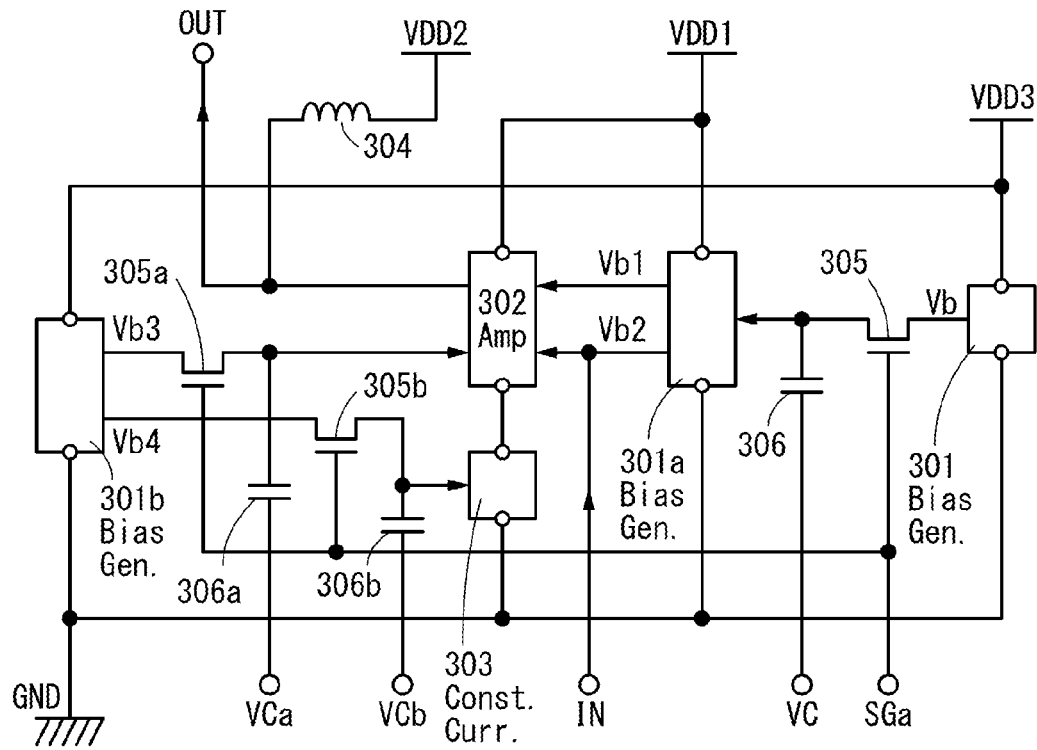
FIGS. 11A and 11B are block diagrams each illustrating an example of a signal processing device.
Figure 11B:
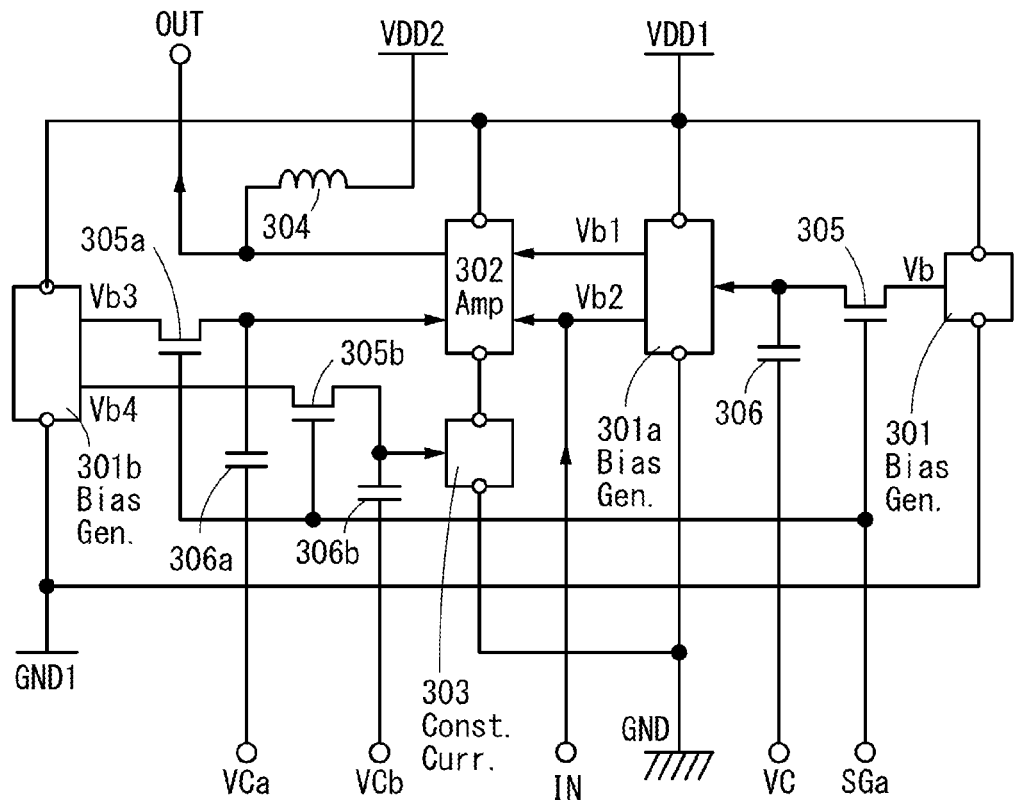

Alternatively, it is possible that no power switch is provided as illustrated in FIGS. 11A and 11B. For example, FIG. 11A illustrates the case where a potential is supplied to a circuit from a plurality of wirings that supplies different potentials. A potential VDD3 is supplied to the high potential sides of the bias generation circuits 301 and 301b. The potential VDD3 is set to a value between the potentials VDD1 and GND. For example, the potential VDD3 is set to the potential GND, whereby current supply to the bias generation circuits 301 and 301b can be interrupted. Similarly, in FIG. 11B, a potential GND1 is supplied to the low potential sides of the bias generation circuits 301 and 301b. The potential GND1 is set to a value between the potentials VDD1 and GND. For example, the potential of the wiring is set to VDD1, whereby current supply to the bias generation circuits 301 and 301b can be interrupted.

Note that the bias generation circuits 301 and 301b are connected to the same power supply line in FIGS. 11A and 11B but are not necessarily connected thereto. A high potential side power supply line and a low potential side power supply line may be further divided and the separate power supply lines are connected to the bias generation circuits 301 and 301b so that the potentials of the bias generation circuits 301 and 301b can be changed.

Figure 12:
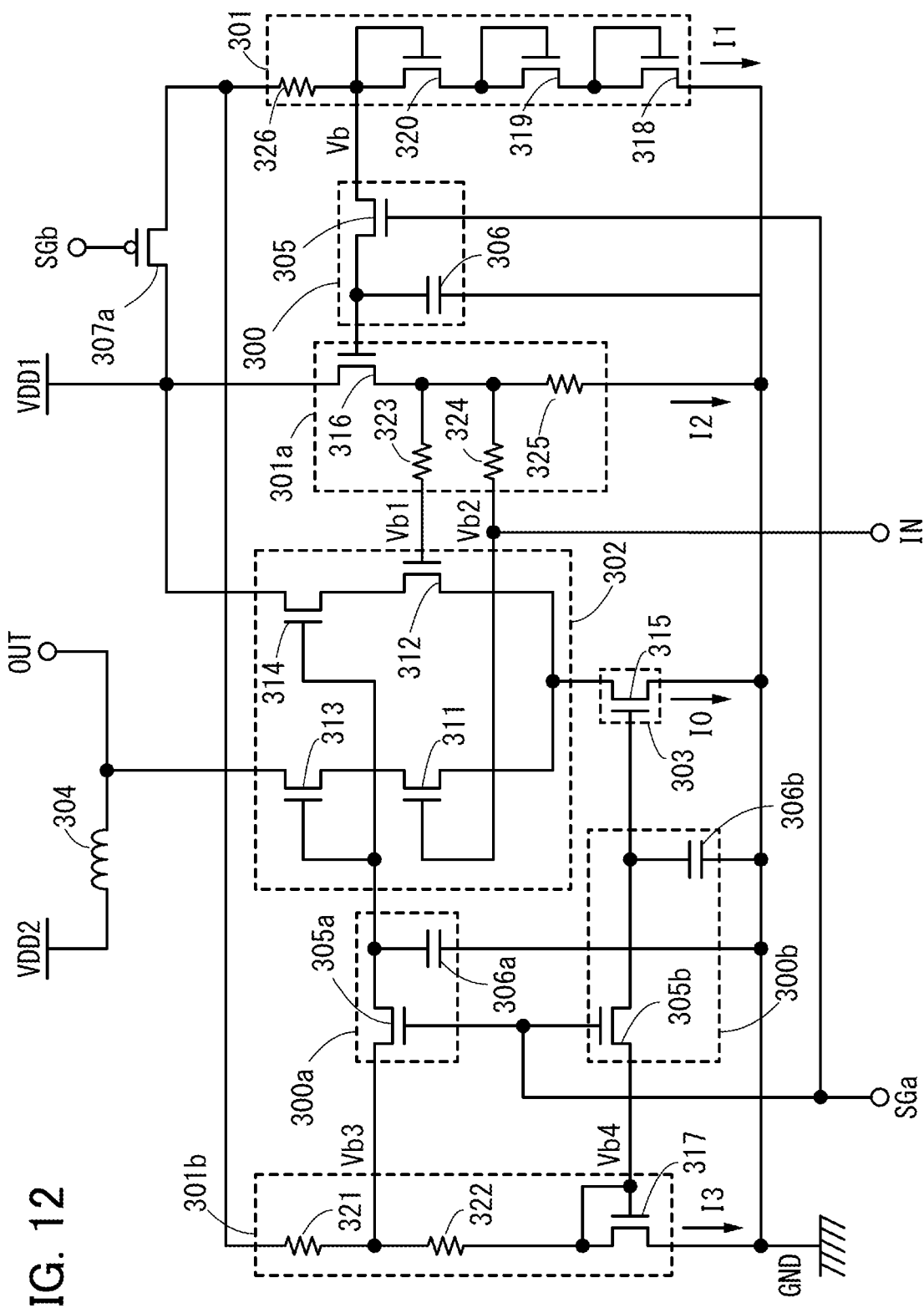
FIG. 12 illustrates an example of a signal processing device.

FIG. 12 illustrates a specific example of an amplifier illustrated in FIG. 8A. The amplifier in FIG. 12 includes the bias generation circuit 301, the bias generation circuit 301a, the bias generation circuit 301b, the amplifier circuit 302, the constant current generation circuit 303, and the inductor 304. The bias generation circuit 301 includes a diode-connected transistor 318, a diode-connected transistor 319, a diode-connected transistor 320, and a resistor 326. The bias generation circuit 301a includes a transistor 316, a resistor 323, a resistor 324, and a resistor 325. The bias generation circuit 301b includes a diode-connected transistor 317, a resistor 321, and a resistor 322. The amplifier circuit 302 includes a differential amplification portion that includes a transistor 311 and a transistor 312, and a transistor 313 and a transistor 314 that serve as cascode transistors. The constant current generation circuit 303 is formed of a transistor 315. The functions thereof are similar to those described with reference to FIG. 2; thus, the details thereof are not repeated.

The amplifier in FIG. 12 further includes the potential holding circuit 300, a potential holding circuit 300a, and a potential holding circuit 300b. The potential holding circuit 300 includes a switch 305 and a capacitor 306. The potential holding circuit 300a includes the switch 305a and the capacitor 306a. The potential holding circuit 300b includes the switch 305b and the capacitor 306b.

Terminals of the bias generation circuits 301 and 301b that are supplied with a high potential (i.e., the resistors 321 and 326) are connected to the power switch 307a. By turning on or off the power switch 307a, power supply to the bias generation circuits 301 and 301b can be controlled.

All the switches 305, 305a, and 305b are controlled by the control signal SGa. The functions thereof are similar to those described with reference to FIG. 8A. All the second electrodes of the capacitors 306, 306a, and 306b are held at the ground potential GND in the drawing but may be held at the potential VDD.

The bias potentials Vb, Vb3, and Vb4 are held in the potential holding circuits 300, 300a, and 300b, respectively, whereby the currents I1 and I3 that flow through the bias generation circuit 301 and 301b, respectively, can be reduced. The percentage of currents I1 and I3 in the total current (I0+I1+I2+I3) that flow through the amplifier in FIG. 12 is up to 50%; thus, holding enables power consumption in the amplifier in FIG. 12 to be reduced by up to half.

In the case where the control signal SGa is generated using the potential VDD and the ground potential GND, the potential VDD is set as follows. In FIG. 12, when the thresholds of the transistors 311 to 320 are all the same, the bias potential Vb is higher than the bias potential Vb4. Although the bias potential Vb3 has to do with the ratio between the resistors 321 and 322 and thus cannot be expressed using only Vth, it is preferably higher than the bias potential Vb in consideration of the structure of the amplifier circuit 302.

Therefore, in the case where the switch 305a in the potential holding circuit 300a is an n-channel transistor whose threshold is Vth1, the high potential of the control signal SGa (a potential at which the switch 305 is turned on) needs to be higher than the sum of the bias potential Vb3 and Vth1.

In general, the theoretical subthreshold value of a MOS transistor at room temperature is approximately 60 mV/digit. Considering the use at higher temperatures and other factors, the subthreshold value of a MOS transistor needs to be approximately 100 mV/digit. Supposing that the on/off ratio is 16 digits, Vth1 is calculated to be 1.6 V. Thus, the high potential of the control signal SGa needs to be higher than the sum of the bias potential Vb3 and 1.6 V.

Considering a margin for obtaining some on-state current, a difference between the high potential of the control signal SGa and the bias potential Vb3 is preferably greater than 2 V obtained by adding 0.4 V to Vth1 (=1.6 V). Furthermore, in order that the high potential of the control signal SGa can be VDD, VDD is set so that VDD>Vb3+2 [V] is satisfied.

The above description is based on the premise that the bias generation circuits 301 and 301b output the ground potential GND in holding because the power switch 307a is provided on the potential VDD side.

In the case where the power switch 307b is provided on the low potential side of the bias generation circuit as illustrated in FIG. 3B, 3D, or 8B, Vth1 may be lower; thus, the above conditions are eased. In that case, it is necessary to consider the lowest bias potential held in the potential holding circuit. In a circuit similar to that in FIG. 12, the lowest bias potential is the bias potential Vb4.

In holding, the power switch 307b in FIG. 8B is off, so that the bias generation circuits 301 and 301b output the potential VDD. That is, in the case where the switches 305, 305a, and 305b are n-channel transistors, the potential of one of a source and a drain thereof is the bias potential Vb, Vb3, or Vb4, and the potential of the other thereof is the potential VDD. The potential of a gate is the ground potential GND. The lowest Vth1 at which sufficient off-state characteristics can be achieved in this state is obtained.

Although the detailed description is omitted, Vth1≥1.6 [V]−Vb4 is satisfied in that case. Therefore, the high potential of the control signal SGa is greater than Vb3+(1.6 [V]−Vb4)+ 0.4 [V]. In the case where the high potential of the control signal SGa is set to the potential VDD, it can be lower than that in the case of FIG. 12 by Vb4.

Note that the above description is given assuming that the potential of the first electrode of the capacitor 306b of the potential holding circuit 300b is not changed. In the case where the potential of the first electrode is changed for some reason, the change affects the minimum value of the threshold. For example, in the case where the bias potential Vb2 output from the bias generation circuit 301a is held in a potential holding circuit formed of a transistor and a capacitor that is similar to the potential holding circuit 300, a potential obtained by superimposing the input signal IN on the bias potential Vb2 is supplied to the first electrode of the capacitor.

The input signal has a high frequency (AC) with an amplitude, and thus the potential of the first electrode of the capacitor is changed. For this reason, in order that the bias potential Vb2 can be held, the threshold and the like of the transistor are selected or set so that the transistor can remain off even when the potential of the first electrode of the capacitor (or a source and a drain of the transistor that is at the same potential as that of the first electrode of the capacitor) is changed. Alternatively, the amplitude of the input signal IN may be limited.

Note that the control signals SGa and SGb (or SGc) or potentials used to generate the control signals may be generated by another integration circuit. For example, in the case where the signal processing device includes a circuit that requires a high voltage as in a liquid crystal display device, the potential of the circuit may be used.

An actual signal processing device is provided with a plurality of amplifiers like those described above. In FIG. 13A, signals and potentials are input to one amplifier RFAMP1. As described above, the control signals SGa and SGb as well as the input signal IN, the amplified output signal OUT, the potential VDD, and the ground potential GND are input to the amplifier. Therefore, it is better to use one circuit that generates the control signals SGa and SGb for the plurality of amplifiers than to provide a circuit that generates the control signals SGa and SGb in each amplifier.

For example, as in a control signal generation system 400a illustrated in FIG. 13B, a timer 401a and a timer 401b are provided; the timer 401a is configured to generate the control signal SGa, and the timer 401b is configured to generate SGb (or SGc). The timers 401a and 401b supply the control signals SGa and SGb (or SGc) so that sampling is performed at regular intervals when the number of clocks generated in the clock generation circuit 402 is counted.

The control signal SGa is supplied from the timer 401a to a plurality of amplifiers (denoted by RFAMP1, RFAMP2, and RFAMP3 in the drawing). The control signal SGb (or SGc) is supplied from the timer 401b to the plurality of amplifiers.

Note that a control signal generation system 400b illustrated in FIG. 13C can be utilized for a method in which sampling is performed only immediately after the power of the signal processing device is turned on as shown in FIG. 5B. In the control signal generation system 400b, a timer 401c and a timer 401d automatically start counting when power is supplied from a power source 404 by the switch 403, and supply the control signals SGa and SGb (or SGc) only once to perform sampling.

Figure 14A:
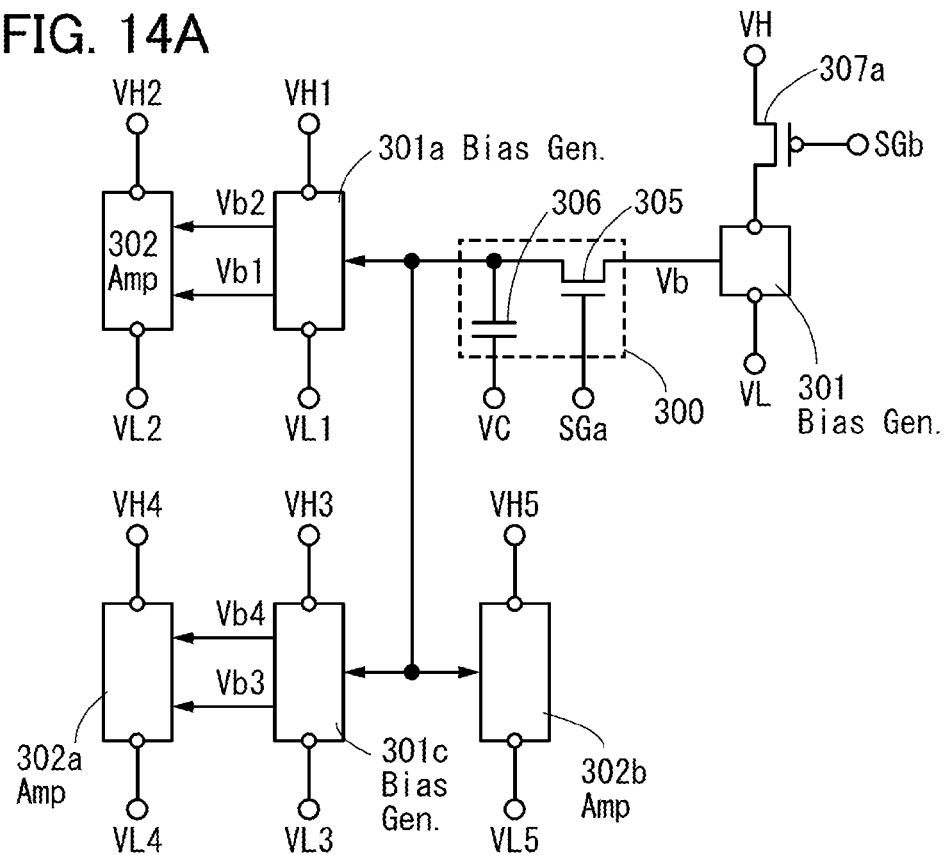
FIGS. 14A and 14B are block diagrams each illustrating an example of a signal processing device.

A potential that is generated in one bias generation circuit and held by a potential holding circuit may be supplied to a plurality of amplifier circuits and/or another bias generation circuit. FIG. 14A illustrates an example thereof. In FIG. 14A, the potential holding circuit 300, the bias generation circuit 301, the bias generation circuit 301a, the amplifier circuit 302, and the power switch 307a are circuits equivalent to those illustrated in FIG. 3C. FIG. 14A illustrates a configuration where a potential held in the potential holing circuit 300 can be supplied to a bias generation circuit 301c and an amplifier circuit 302b as well as the bias generation circuit 301a. A bias potential generated in the bias generation circuit 301c is supplied to the amplifier circuit 302a. Such a configuration can increase integration compared to the configuration where a bias generation circuit and a potential holding circuit are provided in each amplifier.

Figure 14B:
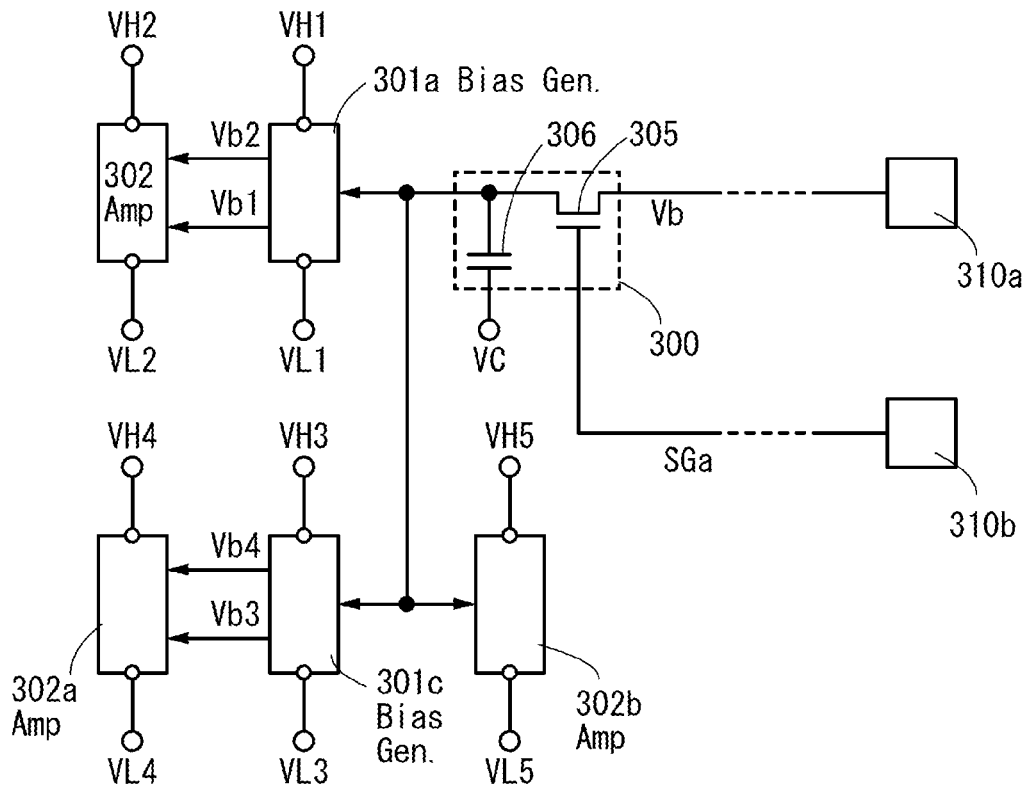

In the case where there is a limitation on the number of bias potentials used in one signal processing circuit, a system illustrated in FIG. 14B is also efficient. For example, the amplifier illustrated in FIG. 12 stores substantially three bias potentials. In a signal processing device illustrated in FIG. 14B, some of the bias generation circuits are not provided, and a potential input from a power feeding terminal 310a is held in the potential holding circuit 300 and is supplied to the amplifier circuits and the bias generation circuits.

Note that when the capacitor 306 is charged, the control signal SGa for controlling the switch 305 needs to be supplied, and the signal may be externally supplied. In that case, the control signal SGa is supplied from a power feeding terminal 310b. When the switch 305 is turned on by the control signal SGa, enough bias potential Vb is supplied to the power feeding terminal 310a. After that, the switch 305 is turned off by the control signal SGa, so that sampling is completed.

After the sampling, the power feeding terminal 310a and the power feeding terminal 310b may be electrically short-circuited. Alternatively, the power feeding terminals 310a and 310b may be at constantly equal potentials using another circuit.

Not only a bias generation circuit but also a power switch and a circuit that generates the control signals SGa and SGb (or SGc) can be eliminated, which can increase integration. Since the configuration is employed in which the bias potential is externally supplied, sampling is preferably performed before shipment. Therefore, the potential holding circuit 300 needs to have sufficient holding characteristics.

For example, it is effective to make the capacitor 306 have an enough size. Sufficiently large capacitance of the capacitor 306 is effective in reducing a change of charge due to the influence of noise or radiation.

Furthermore, the dielectric of the capacitor 306 may be formed using a thermal oxide film of single crystal silicon that has an excellent insulating property. In the case where the switch 305 is formed of a MOS transistor, the thickness of a gate insulating film may be increased as long as the subthreshold characteristics are not degraded by a short-channel effect.

In general, when a gate insulating film is increased in thickness, a voltage between a source and a gate is required to be increased to turn on a MOS transistor. This is avoided in an integrated circuit but does not cause a practical problem in the signal processing device illustrated in FIG. 14B because a signal for controlling the switch 305 is externally supplied for one sampling and a circuit that generates a high voltage does not have to be provided in a signal processing circuit itself.

This embodiment can be implemented in combination with any of the other embodiments as appropriate.

Embodiment 2

In this embodiment, an example of a cross-sectional structure of a signal processing device will be described with reference to FIG. 15. In the example of this embodiment, the bias generation circuit, the amplifier circuit, and the like that are described in Embodiment 1 each include a transistor using silicon or the like, and the potential holding circuit including a transistor using an oxide semiconductor is stacked over the circuits.

Figure 15:
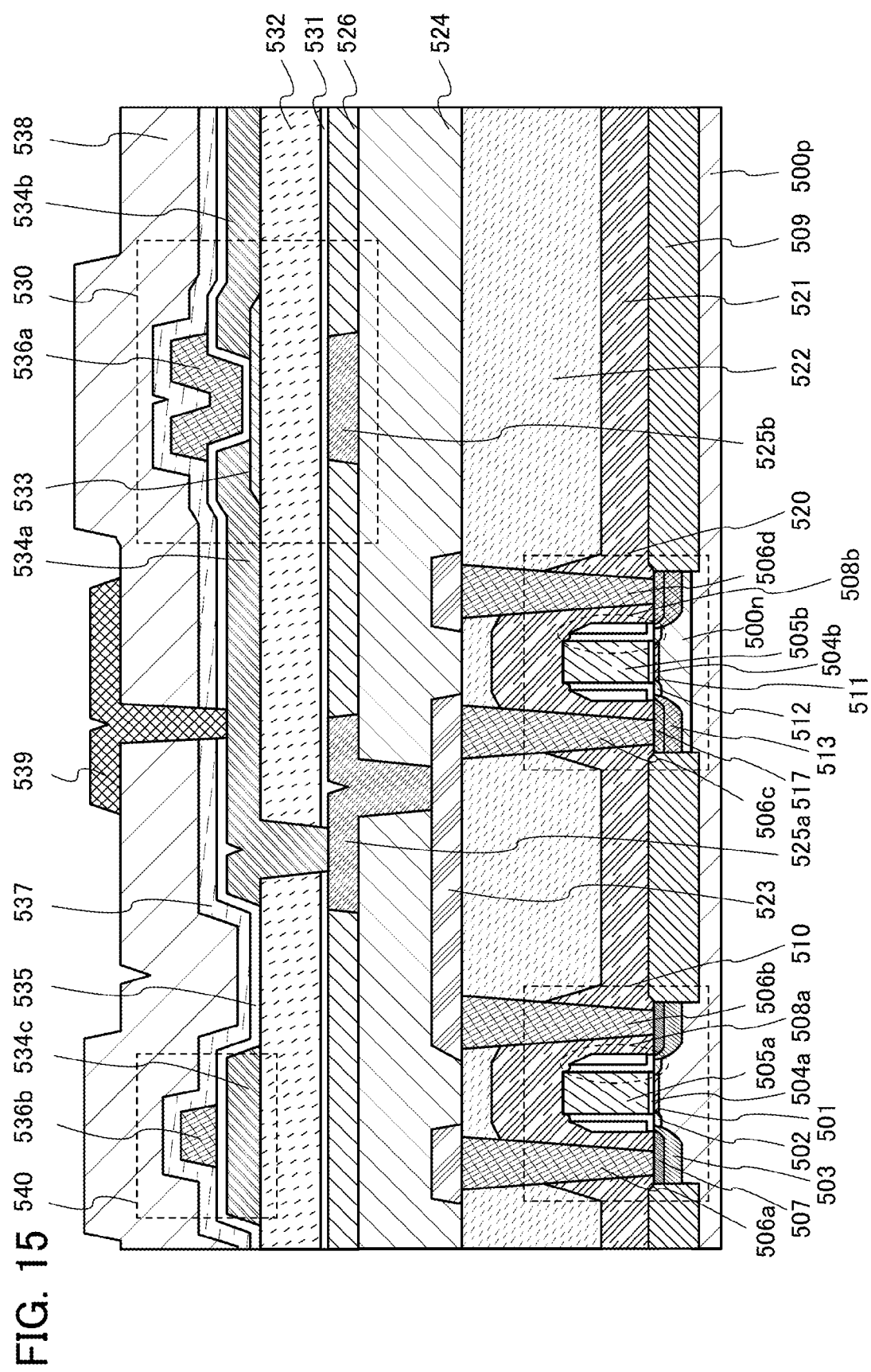
FIG. 15 illustrates an example of a cross-sectional structure of a signal processing device.

FIG. 15 illustrates a cross section of a part of the signal processing device. The signal processing device illustrated in FIG. 15 includes an n-channel transistor and a p-channel transistor each using a first semiconductor material (e.g., silicon) in a lower portion and a transistor using a second semiconductor material (e.g., an oxide semiconductor) and a capacitor in an upper portion.

<Structures of Lower Transistors>

An n-channel transistor 510 includes a channel formation region 501 provided in a p-type well 500p, low-concentration impurity regions 502 and high-concentration impurity regions 503 (collectively simply referred to as impurity regions in some cases) with the channel formation region 501 provided between the impurity regions, conductive regions 507 provided in contact with the impurity regions, a gate insulating film 504a provided over the channel formation region 501, a gate electrode 505a provided over the gate insulating film 504a, and a source electrode 506a and a drain electrode 506b provided in contact with the conductive regions 507. Sidewall insulating films 508a are provided on side surfaces of the gate electrode 505a. An interlayer insulating film 521 and an interlayer insulating film 522 are provided so as to cover the transistor 510. The source electrode 506a and the drain electrode 506b are connected to the conductive regions 507 through openings formed in the interlayer insulating films 521 and 522. The conductive regions 507 can be formed using metal silicide or the like.

A p-channel transistor 520 includes a channel formation region 511 provided in an n-type well 500n, low-concentration impurity regions 512 and high-concentration impurity regions 513 (collectively simply referred to as impurity regions in some cases) with the channel formation region 511 provided between the impurity regions, conductive regions 517 provided in contact with the impurity regions, a gate insulating film 504b provided over the channel formation region 511, a gate electrode 505b provided over the gate insulating film 504b, and a source electrode 506c and a drain electrode 506d provided in contact with the conductive regions 517. Sidewall insulating films 508b are provided on side surfaces of the gate electrode 505b. The interlayer insulating film 521 and the interlayer insulating film 522 are provided so as to cover the transistor 520. The source electrode 506c and the drain electrode 506d are connected to the conductive regions 517 through openings formed in the interlayer insulating films 521 and 522.

Furthermore, element separation insulating films 509 are provided so as to surround each of the transistors 510 and 520.

Although FIG. 15 illustrates the case where a triple-well structure is employed, a double-well structure, a twin-well structure, or single-well structure may alternatively be employed. Although the case where the channels of the transistors 510 and 520 are formed in the p-type well 500p and the n-type well 500n formed in a substrate, respectively, is illustrated in FIG. 15, the channels of the transistors 510 and 520 may be formed in an amorphous semiconductor film or a polycrystalline semiconductor film formed over an insulating surface. Alternatively, the channels may be formed in a single crystal semiconductor film, like in the case of using an SOI substrate.

When the transistors 510 and 520 are formed using a single crystal semiconductor substrate, the transistors 510 and 520 can operate at high speed and the thresholds can be precisely controlled. Accordingly, it is preferable that the bias generation circuit, the amplifier circuit, and the like in any of the signal processing devices described in the above embodiments be formed using a single crystal semiconductor substrate.

The transistor 510 and the transistor 520 are connected to each other through a wiring 523, and an insulating film 524 is provided over the wiring 523. Furthermore, conductive layers 525a and 525b and an insulating film 526 are provided over the insulating film 524. The insulating film 526 is preferably formed in such a manner that after the conductive layers 525a and 525b are formed over the insulating film 524, an insulating film 526 is formed over the conductive layers 525a and 525b and then the insulating film 526 is subjected to polishing treatment until upper surfaces of the conductive layers 525a and 525b are exposed.

<Structure of Upper Transistor>

An upper transistor 530 is a transistor whose channel is formed in a film of a semiconductor having a wider band gap than silicon. The transistor 530 includes the conductive layer 525a provided over the insulating film 524, an insulating film 531 and an insulating film 532 provided over the conductive layer 525a, a semiconductor film 533 provided over the insulating film 532, a source electrode 534a and a drain electrode 534b provided in contact with the semiconductor film 533, a gate insulating film 535 provided over the semiconductor film 533, the source electrode 534a, and the drain electrode 534b, and a gate electrode 536a provided over the gate insulating film 535. Note that the conductive layer 525a serves as a gate electrode.

FIG. 15 illustrates the case where upper and lower gate electrodes are provided with a semiconductor film provided therebetween. Both the gate electrodes may be supplied with a signal for controlling whether to turn on or off the transistor, or only one of the gate electrodes may be supplied with a fixed potential such as a ground potential. The level of the fixed potential is controlled, whereby the threshold of the transistor can be controlled.

A conductive layer 534c is provided over the insulating film 532, the gate insulating film 535 is provided over the conductive layer 534c, and a conductive layer 536b is provided over the gate insulating film 535. The conductive layer 534c, the gate insulating film 535, and the conductive layer 536b form a capacitor 540.

An interlayer insulating film 537 and an interlayer insulating film 538 are provided so as to cover the transistor 530 and the capacitor 540. The drain electrode 534b is connected to a wiring 539 through an opening formed in the interlayer insulating films 537 and 538.

As the film of the semiconductor having a wider band gap than silicon, for example, a film of a compound semiconductor such as an oxide semiconductor or a nitride semiconductor can be given. In this embodiment, the case where an oxide semiconductor is used for the semiconductor film 533 is described.

The oxide semiconductor used for the transistor 530 is preferably a purified oxide semiconductor in which impurities serving as electron donors (donors), such as moisture or hydrogen, are reduced and oxygen vacancies are reduced. The purified oxide semiconductor is an i-type (intrinsic) semiconductor or a substantially i-type semiconductor.

The term "substantially intrinsic" refers to the state where an oxide semiconductor has a carrier density lower than $1 \times 10^{17}/cm^3$, preferably lower than $1 \times 10^{15}/cm^3$, more preferably lower than $1 \times 10^{13}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity level becomes a trap, which might deteriorate the electric characteristics of the transistor. Therefore, it is preferable to reduce the concentration of the impurities in the oxide semiconductor and at the interface with the oxide semiconductor.

In order to make the oxide semiconductor intrinsic or substantially intrinsic, in SIMS (secondary ion mass spectrometry), for example, the concentration of silicon at a certain depth of the oxide semiconductor film or in a region of the oxide semiconductor film is preferably lower than $1 \times 10^{19}$ atoms/$cm^3$, more preferably lower than $5 \times 10^{18}$ atoms/$cm^3$, still more preferably lower than $1 \times 10^{18}$ atoms/$cm^3$.

Furthermore, the concentration of hydrogen at a certain depth of the oxide semiconductor film or in a region of the oxide semiconductor film is preferably lower than or equal to $2 \times 10^{20}$ atoms/$cm^3$, more preferably lower than or equal to $5 \times 10^{19}$ atoms/$cm^3$, still more preferably lower than or equal to $1 \times 10^{19}$ atoms/$cm^3$, yet still more preferably lower than or equal to $5 \times 10^{18}$ atoms/$cm^3$.

Furthermore, the concentration of nitrogen at a certain depth of the oxide semiconductor film or in a region of the oxide semiconductor film is preferably lower than $5 \times 10^{19}$ atoms/$cm^3$, more preferably lower than or equal to $5 \times 10^{18}$ atoms/$cm^3$, still more preferably lower than or equal to $1 \times 10^{18}$ atoms/$cm^3$, yet still more preferably lower than or equal to $5 \times 10^{17}$ atoms/$cm^3$.

In addition, in the case where the oxide semiconductor film includes a crystal, the crystallinity of the oxide semiconductor film might be decreased if silicon or carbon is contained at high concentration. In order not to lower the crystallinity of the oxide semiconductor film, for example, the concentration of silicon at a certain depth of the oxide semiconductor film or in a region of the oxide semiconductor film may be lower than $1 \times 10^{19}$ atoms/$cm^3$, preferably lower than $5 \times 10^{18}$ atoms/$cm^3$, more preferably lower than $1 \times 10^{18}$ atoms/$cm^3$.

Furthermore, the concentration of carbon at a certain depth of the oxide semiconductor film or in a region of the oxide semiconductor film may be lower than $1 \times 10^{19}$ atoms/$cm^3$, preferably lower than $5 \times 10^{18}$ atoms/$cm^3$, more preferably lower than $1 \times 10^{18}$ atoms/$cm^3$, for example.

A transistor in which a highly purified oxide semiconductor film is used for a channel formation region as described above has an extremely low off-state current. When the voltage between a source and a drain is set to approximately 0.1 V to 10 V, for example, the off-state current standardized on the channel width of the transistor can be as low as several yoctoamperes per micrometer to several zeptoamperes per micrometer.

The insulating film 532 can have a function of supplying oxygen to the semiconductor film 533 formed using an oxide semiconductor. For this reason, the insulating film 532 is preferably an insulating film containing oxygen and more preferably, the insulating film 532 is an insulating film containing oxygen in which the oxygen content is higher than that in the stoichiometric composition. The insulating film 532 also serves as an interlayer insulating film. In that case, since the insulating film 532 has an uneven surface, the insulating film 532 is preferably subjected to planarization treatment such as chemical mechanical polishing (CMP) treatment so as to have a flat surface.

The gate insulating film 535 can be formed of an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, hafnium oxide, aluminum oxide, aluminum silicate, neodymium oxide, and tantalum oxide. In the case where a material of the gate insulating film 535 has a high relative dielectric constant, the gate insulating film 535 can be formed thick. For example, in the case of using hafnium oxide with a relative dielectric constant of 16, the gate insulating film 535 can be formed approximately four times as thick as the gate insulating film 535 using silicon oxide with a relative dielectric constant of 3.9. Thus, the leakage current through the gate insulating film 535 can be suppressed.

For example, like in the case of a stack of silicon oxide and hafnium oxide, part is formed using a material having a lot of electron trap states, such as hafnium oxide, aluminum oxide, tantalum oxide, or silicon nitride, or a floating gate, and the state where the potential of the gate electrode 536a is higher than that of the source electrode 534a or the drain electrode 534b may be maintained for one second or more, typically one minute or more, at a higher temperature (a temperature higher than the operating temperature or the storage temperature of the semiconductor device, or a temperature of 125° C. or higher and 450° C. or lower, typically a temperature of 150° C. or higher and 300° C. or lower).

Thus, electrons transfer from the semiconductor film 533 to the gate electrode 536a, and some of the electrons are trapped by the electron trap states. In the transistor in which necessary electrons are trapped by the electron trap states in this manner, the threshold shifts in the positive direction. By controlling the voltage of the gate electrode 536a, the amount of electrons to be trapped can be controlled, and thus, the threshold can be controlled. Furthermore, the treatment for trapping the electrons may be performed in the manufacturing process of the transistor.

For example, the treatment is preferably performed in any step before factory shipment, such as after the preceding process (wafer processing), after a wafer-dicing step, or after packaging. In any of the cases, it is preferable that the semiconductor device be not exposed to temperatures of 125° C. or higher for 1 hour or more after the threshold adjustment process.

For the gate electrode 536a and the conductive layer 536b, a conductive film of Al, Ti, Cr, Co, Ni, Cu, Y, Zr, Mo, Ru, Ag, Ta, W, or the like can be used. Alternatively, a stack of the above materials may be used. Alternatively, a conductive film containing nitrogen may be used. For example, a stack in which a titanium nitride film and a tungsten film are stacked in this order, a stack in which a tungsten nitride film and a tungsten film are stacked in this order, a stack in which a tantalum nitride film and a tungsten film are stacked in this order, or the like can be used.

The interlayer insulating film 537 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, and tantalum oxide. The oxide insulating film may be a stack of any of the above materials.

The interlayer insulating film 537 is preferably an oxide insulating film containing excess oxygen. An oxide insulating film containing excess oxygen refers to an oxide insulating film from which oxygen can be released by heat treatment or the like. The oxide insulating film containing excess oxygen is preferably a film in which the amount of released oxygen when converted into oxygen atoms is greater than or equal to $1.0\times10^{19}$ atoms/cm$^3$ in thermal desorption spectroscopy (TDS) analysis. Note that the substrate temperature in the TDS analysis is preferably higher than or equal to 100° C. and lower than or equal to 700° C., or higher than or equal to 100° C. and lower than or equal to 500° C. Oxygen released from the oxide insulating film can be diffused to the channel formation region in the semiconductor film 533 that is formed using an oxide semiconductor, so that oxygen vacancies formed in the channel formation region can be filled with the oxygen. Thus, stable electric characteristics of the transistor can be achieved.

The transistor using the oxide semiconductor has a characteristic of a significantly low off-state current. The band gap of the oxide semiconductor is 2 eV or more, preferably 2.5 eV or more, more preferably 3 eV or more. With the use of the oxide semiconductor film that is purified by sufficiently reducing the concentration of impurities such as moisture or hydrogen and reducing oxygen vacancies, the off-state current of the transistor can be significantly reduced.

Specifically, various experiments can prove the small off-state current of a transistor in which a highly purified oxide semiconductor is used for a semiconductor film. For example, the off-state current of even an element with a channel width of $1\times10^6$ µm and a channel length of 10 µm can be less than or equal to the measurement limit of a semiconductor parameter analyzer, that is, less than or equal to $1\times10^{-13}$ A when the voltage between a source terminal and a drain terminal (drain voltage) ranges from 1 V to 10 V. In this case, the off-state current density corresponding to a value obtained by dividing the off-state current by the channel width of the transistor is 100 zA/µm or less. In addition, the off-state current density is measured using a circuit in which a capacitor and a transistor are connected to each other and charge flowing into or from the capacitor is controlled by the transistor. For the measurement, the transistor in which a channel formation region is formed in a purified oxide semiconductor film is used, and the off-state current density of the transistor is measured from a change in the amount of charge of the capacitor per unit time. As a result, a lower off-state current density of several tens of yoctoamperes per micrometer (yA/µm) is obtained at a voltage between the source terminal and the drain terminal of the transistor of 3 V. Consequently, it can be said that the off-state current of the transistor in which the channel formation region is formed in the purified oxide semiconductor film is significantly lower than that of a transistor using silicon.

The oxide semiconductor preferably contains at least indium (In) or zinc (Zn). As a stabilizer for reducing variations in the electric characteristics of a transistor using the oxide semiconductor, one or more selected from gallium (Ga), tin (Sn), hafnium (Hf), aluminum (Al), and zirconium (Zr) is preferably contained in addition to In or Zn.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that, for example, an In—Ga—Zn-based oxide means an oxide containing In, Ga, and Zn and there is no particular limitation on the ratio of In:Ga:Zn. Further, the In—Ga—Zn-based oxide may contain a metal element other than In, Ga, and Zn. The In—Ga—Zn-based oxide has sufficiently high resistance when no electric field is applied thereto, so that the off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to any of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), In:Sn:Zn=2:1:5 (=1/4:1/8:5/8), or an oxide with an atomic ratio close to any of the above atomic ratios can be used.

For example, with an In—Sn—Zn-based oxide, high mobility can be achieved relatively easily. However, even with an In—Ga—Zn-based oxide, mobility can be increased by reducing the defect density in the bulk.

A structure of the oxide semiconductor film will be described below.

In this specification and the like, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter, a surface over which the CAAC-OS film is formed is referred to as a formation surface) or the top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal arrangement in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. When the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film including an InGaZnO$_4$ crystal is analyzed by an out-of-plane method, a peak of 2θ may also be observed at around 36°, in addition to the peak of 2θ at around 31°. The peak of 2θ at around 36° indicates that a crystal part having no c-axis alignment is included in part of the CAAC-OS film. It is preferable that in the CAAC-OS film, a peak of 2θ appears at around 31° and a peak of 2θ does not appear at around 36°.

The CAAC-OS film is an oxide semiconductor film having a low impurity concentration. The impurity is an element other than the main components of the oxide semiconductor film, such as hydrogen, carbon, silicon, and a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, heavy metals such as iron and nickel, argon, carbon dioxide, and the like each have a large atomic radius (molecular radius), and thus disturb the atomic arrangement of the oxide semiconductor film and causes a decrease in crystallinity when any of them is contained in the oxide semiconductor film. Note that the impurity contained in the oxide semiconductor film might serve as a carrier trap or a carrier generation source.

Furthermore, the CAAC-OS film is an oxide semiconductor film having a low density of defect states. For example, oxygen vacancies in the oxide semiconductor film serve as carrier traps or serve as carrier generation sources in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold (is rarely normally on). The highly purified intrinsic or substantially highly purified intrinsic oxide semiconductor film has few carrier traps. Accordingly, the transistor including the oxide semiconductor film has small variations in electrical characteristics and high reliability. Electric charge trapped by the carrier traps in the oxide semiconductor film takes a long time to be released, and might behave like fixed electric charge. Thus, a transistor including an oxide semiconductor film having a high impurity concentration and a high density of defect states has unstable electrical characteristics in some cases.

In a transistor using the CAAC-OS film, a change in electrical characteristics due to irradiation with visible light or ultraviolet light is small.

Next, a microcrystalline oxide semiconductor film will be described.

In an image obtained with TEM, crystal parts cannot be found clearly in the microcrystalline oxide semiconductor film in some cases. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm or a size greater than or equal to 1 nm and less than or equal to 3 nm is specifically referred to as nanocrystal (nc). An oxide semiconductor film including a nanocrystal is referred to as a nanocrystalline oxide semiconductor (nc-OS) film. In an image obtained with TEM, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than a crystal part, a peak which shows a crystal plane does not appear. Further, a halo pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film which is obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has higher regularity than an amorphous oxide semiconductor film. Therefore, the nc-OS film has a lower density of defect states than an amorphous oxide semiconductor film. Note that there is no regularity of crystal orientation between different crystal parts in the nc-OS film; hence, the nc-OS film has a higher density of defect states than the CAAC-OS film.

Note that an oxide semiconductor film may be a stack including two or more kinds of an amorphous oxide semiconductor film, a microcrystalline oxide semiconductor film, and a CAAC-OS film, for example.

For example, a CAAC-OS film can be deposited by a sputtering method using a polycrystalline oxide semiconductor sputtering target. When ions collide with the sputtering target, a crystal region included in the sputtering target may be separated from the target along an a-b plane; in other words, sputtered particles each having a plane parallel to an a-b plane (flat-plate-like sputtered particles or pellet-like sputtered particles) may flake off from the sputtering target. In that case, the flat-plate-like or pellet-like sputtered particles reach a substrate while keeping its crystal state, whereby the CAAC-OS film can be formed over the substrate.

It is preferable that hydrogen not be contained in the semiconductor film 533 before, during, and after the deposition. For example, it is preferable that the semiconductor film 533 be formed so as to contain hydrogen as little as possible at the time of the deposition of the semiconductor film 533 and that heat treatment for dehydration or dehydrogenation be performed after the deposition of the semiconductor film 533. Furthermore, it is preferable that an insulating film in contact with the semiconductor film 533 be formed so as to contain hydrogen as little as possible at the time of the deposition of the insulating film and that heat treatment for dehydration or dehydrogenation be performed after the deposition of the insulating film.

When a film that prevents hydrogen from passing therethrough is used as the insulating film 531, hydrogen contained in the lower transistors, the insulating film 524, the interlayer insulating film 522, and the like can be prevented from reaching the semiconductor film 533. As the film that prevents hydrogen from passing therethrough, a silicon nitride film, a silicon oxynitride film, an aluminum oxide film, an aluminum oxynitride film, or the like is preferably used. In addition, when a film that prevents hydrogen from passing therethrough is used as the interlayer insulating film 537, hydrogen contained in the interlayer insulating film 538 can be prevented from reaching the semiconductor film 533.

Treatment for supplying oxygen to the semiconductor film 533 is preferably performed in order to reduce oxygen vacancies in the semiconductor film 533. For example, when an insulating film containing an excess amount of oxygen is provided in contact with the semiconductor film 533 and heat treatment is performed, oxygen can be supplied to the semiconductor film 533 from the insulating film containing an excess amount of oxygen. Oxygen is supplied to the semiconductor film 533, whereby oxygen vacancies in the semiconductor film 533 can be reduced. Treatment for adding oxygen to the semiconductor film 533 may be performed after the semiconductor film 533 is subjected to dehydration or dehydrogenation treatment. As to the treatment for adding oxygen, an oxygen radical, ozone, an oxygen atom, an oxygen ion, or the like is added to the semiconductor film 533 by an ion implantation method, an ion doping method, plasma treatment, or the like, for example.

When the amount of impurities and oxygen vacancies in the semiconductor film 533 is reduced in this manner, generation of carriers can be suppressed. Suppressing the increase in carrier density can suppress negative shift of the threshold of the transistor due to the carrier density. As a result, the threshold of the transistor can be easily controlled by a potential applied to the other of the gate electrodes of the transistor.

This embodiment can be implemented in combination with any of the other embodiments as appropriate.

Embodiment 3

In this embodiment, a transistor used in the potential holding circuit of the signal processing circuit of Embodiment 1 will be described with reference to drawings. The transistor described in this embodiment corresponds to the upper transistor of Embodiment 2 and a bias generation circuit, an amplifier circuit, and the like are formed using a single crystal semiconductor substrate and the like as in Embodiment 2; thus the descriptions thereof are omitted here. In addition, the contents of the upper transistor described in Embodiment 2 may also be omitted.

Figure 16A:
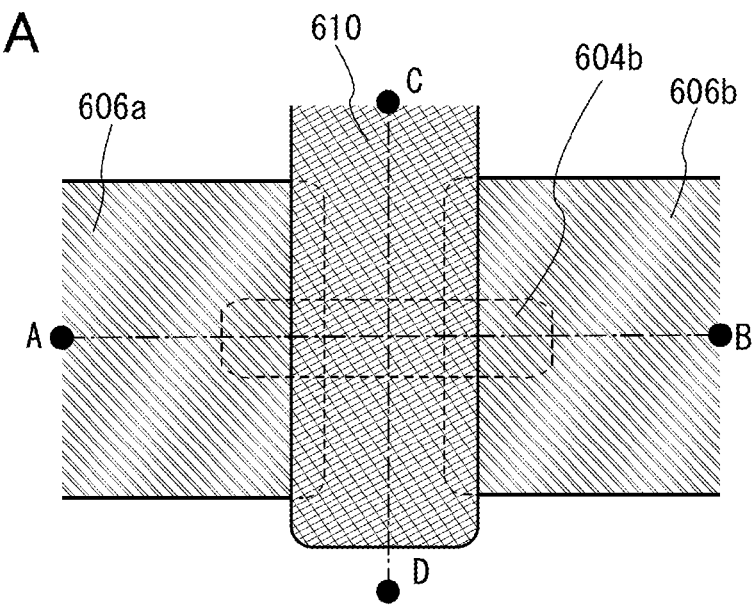
FIGS. 16A to 16C illustrate a structural example of a transistor included in a signal processing device.
Figure 16B:
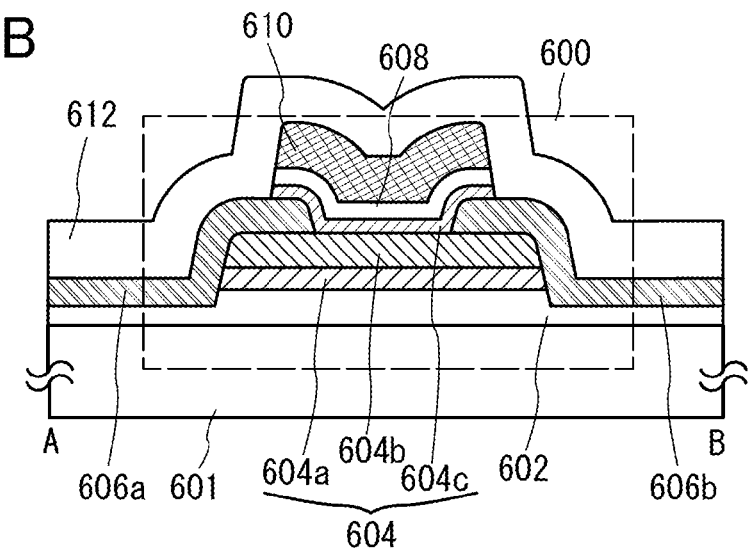
Figure 16C:
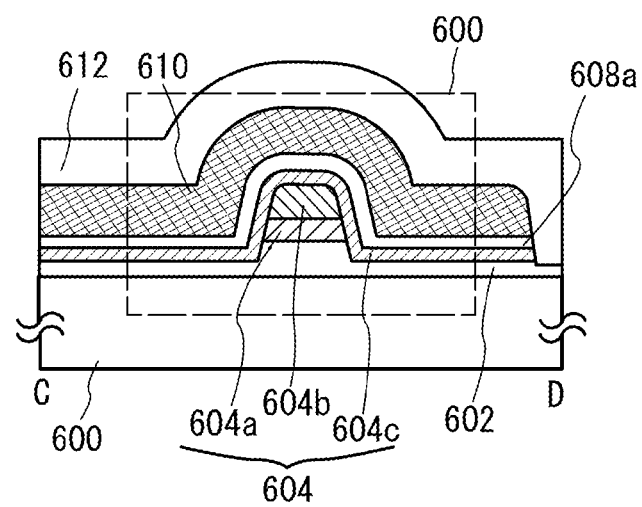

FIGS. 16A to 16C are a top view and cross-sectional views of the transistor of this embodiment. FIG. 16A is the top view. FIG. 16B illustrates a cross section along dashed-dotted line A-B in FIG. 16A. FIG. 16C illustrates a cross section along dashed-dotted line C-D in FIG. 16A. Note that for simplification of the drawing, some components in the top view of FIG. 16A are not illustrated. The direction of dashed-dotted line A-B may be referred to as the channel length direction, and the direction of dashed-dotted line C-D may be referred to as a channel width direction.

A transistor 600 illustrated in FIGS. 16A to 16C includes the following components: a base insulating film 602 having a depressed portion and a projected portion over an insulating film 601; an oxide semiconductor 604a and an oxide semiconductor 604b over the projected portion of the base insulating film 602; a source electrode 606a and a drain electrode 606b over the oxide semiconductor 604a and the oxide semiconductor 604b; an oxide semiconductor 604c that is in contact with the depressed portion of the base insulating film 602, side surfaces of the projected portion (or the depressed portion) of the base insulating film 602, side surfaces of the oxide semiconductor 604a, the top surface and side surfaces of the oxide semiconductor 604b, the source electrode 606a, and the drain electrode 606b; a gate insulating film 608 over the oxide semiconductor 604c; a gate electrode 610 that is over and in contact with the gate insulating film 608 and faces the top surface and the side surfaces of the oxide semiconductor 604b; and an oxide insulating film 612 over the source electrode 606a, the drain electrode 606b, and the gate electrode 610. The oxide semiconductor 604a, the oxide semiconductor 604b, and the oxide semiconductor 604c are collectively referred to as a multilayer oxide semiconductor 604.

Note that a channel length refers to the distance between a source (a source region or a source electrode) and a drain (a drain region or a drain electrode) in a region where a semiconductor film and a gate electrode overlap with each other in a top view. That is, the channel length in FIG. 16A is the distance between the source electrode 606a and the drain electrode 606b in the region where the oxide semiconductor 604b overlaps with the gate electrode 610. A channel width refers to the width of a source or a drain in the region where a semiconductor film and a gate electrode overlap with each other. Thus, the channel width in FIG. 16A is the width of the source electrode 606a or the drain electrode 606b in the region where the oxide semiconductor 604b and the gate electrode 610 overlap with each other.

The gate electrode 610 electrically surrounds the oxide semiconductor 604b, so that the on-state current can be increased. Such a transistor structure is referred to as a surrounded channel (s-channel) structure. In the s-channel structure, a current flows through an entire region of the oxide semiconductor 604b (bulk). When a current flows inside the oxide semiconductor 604b, the current is unlikely to be affected by interface scattering, leading to a high on-state current. Note that increasing the thickness of the oxide semiconductor 604b leads to an increase in on-state current. Thus, even when the gate electrode 610 extends (toward the base insulating film 602 side) to a portion lower than the interface between the oxide semiconductor 604a and the oxide semiconductor 604b, the channel width is not affected by such a structure, and the channel width can be made small. Thus, the high density (high integration) can be achieved.

In fabricating a transistor with a small channel length and a small channel width, when an electrode, a semiconductor film, or the like is processed while a resist mask is reduced in size, the electrode, the semiconductor film, or the like has a round end portion (curved surface) in some cases. With this structure, the coverage with the gate insulating film 608, the gate electrode 610, and the oxide insulating film 612, which are to be formed over the oxide semiconductor 604b, can be improved. In addition, electric field concentration that might occur at end portions of the source electrode 606a and the drain electrode 606b can be reduced, which can inhibit deterioration of the transistor.

Miniaturization of a transistor leads to high integration and high density. For example, the channel length of the transistor is set to less than or equal to 100 nm, preferably less than or equal to 40 nm, more preferably less than or equal to 30 nm, still more preferably less than or equal to 20 nm, and the channel width of the transistor is set to less than or equal to 100 nm, preferably less than or equal to 40 nm, more preferably less than or equal to 30 nm, still more preferably less than or equal to 20 nm. The transistor of this embodiment has an s-channel structure. Therefore, even when the channel width is shortened to the above range, a high on-state current can be achieved.

The multilayer oxide semiconductor 604 in the channel formation region of the transistor 600 has a structure in which the oxide semiconductor 604a, the oxide semiconductor 604b, and the oxide semiconductor 604c are stacked in this order from the insulating film 601 side. The oxide semiconductor 604b is surrounded by the oxide semiconductor 604a and the oxide semiconductor 604c. As illustrated in FIG. 16C, the gate electrode 610 electrically covers the oxide semiconductor 604b. Note that all the oxide semiconductors 604a, 604b, and 604c do not need to be provided and any one of them may be omitted.

Here, as the oxide semiconductor 604b, for example, an oxide semiconductor whose electron affinity (an energy difference between a vacuum level and the conduction band bottom) is higher than those of the oxide semiconductor 604a and the oxide semiconductor 604c is used. The electron affinity can be obtained by subtracting an energy difference between the bottom of a conduction band and the top of a valence band (what is called an energy gap) from an energy difference between the vacuum level and the top of the valence band (what is called an ionization potential).

The oxide semiconductor 604a and the oxide semiconductor 604c each contain one or more kinds of metal elements contained in the oxide semiconductor 604b. For example, the oxide semiconductor 604a and the oxide semiconductor 604c are preferably formed using an oxide semiconductor whose energy of the bottom of the conduction band is closer to a vacuum level than that of the oxide semiconductor 604b is, by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode 610, a channel is formed in the oxide semiconductor 604b whose energy of the bottom of the conduction band is the lowest in the multilayer oxide semiconductor 604. In other words, the oxide semiconductor 604c is formed between the oxide semiconductor 604b and the gate insulating film 608, whereby a structure in which the channel of the transistor is formed so as not to be in contact with the gate insulating film is obtained.

Since the oxide semiconductor 604a contains one or more metal elements contained in the oxide semiconductor 604b, an interface state is less likely to be formed at the interface of the oxide semiconductor 604b with the oxide semiconductor 604a than at the interface with the base insulating film 602 when the oxide semiconductor 604b is in contact with the base insulating film 602. The interface sometimes forms a channel; therefore, the threshold of the transistor fluctuates in some cases. Thus, providing the oxide semiconductor 604a leads to reduction in fluctuations of the electric characteristics of the transistors, such as a threshold. Furthermore, the reliability of the transistor can be improved.

Since the oxide semiconductor 604c contains one or more metal elements contained in the oxide semiconductor 604b, scattering of carriers is less likely to occur at the interface of the oxide semiconductor 604b with the oxide semiconductor 604c than at the interface with the gate insulating film 608 when the oxide semiconductor 604b is in contact with the gate insulating film 608. Therefore, providing the oxide semiconductor 604c leads to an increase in the field-effect mobility of the transistor.

For the oxide semiconductor 604a and the oxide semiconductor 604c, for example, a material containing Al, Ti, Ga, Ge, Y, Zr, Sn, La, Ce, or Hf at a higher atomic ratio than that used for the oxide semiconductor 604b can be used. Specifically, the atomic ratio of any of the above metal elements in the oxide semiconductor 604a and the oxide semiconductor 604c is 1.5 times or more, preferably 2 times or more, more preferably 3 times or more as much as that in the oxide semiconductor 604b. Any of the above metal elements is strongly bonded to oxygen and thus has a function of inhibiting generation of an oxygen vacancy in the oxide semiconductor layer. That is, an oxygen vacancy is less likely to be generated in the oxide semiconductor 604a and the oxide semiconductor 604c than in the oxide semiconductor 604b.

Note that when each of the oxide semiconductor 604a, the oxide semiconductor 604b, and the oxide semiconductor 604c is an In-M-Zn oxide containing at least indium, zinc, and M (M is a metal such as Al, Ti, Ga, Ge, Y, Zr, Sn, La, Ce, or Hf), and the oxide semiconductor 604a has an atomic ratio of In to M and Zn which is $x_1:y_1:z_1$, the oxide semiconductor 604b has an atomic ratio of In to M and Zn which is $x_2:y_2:z_2$, and the oxide semiconductor 604c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more as large as $y_2/x_2$, preferably 2 times or more as large as $y_2/x_2$, more preferably 3 times or more as large as $y_2/x_2$. In that case, when $y_2$ is larger than or equal to $x_2$ in the oxide semiconductor 604b, the transistor can have stable electric characteristics. However, when $y_2$ is 3 times or more as large as $x_2$, the field-effect mobility of the transistor is reduced; accordingly, $y_2$ is preferably smaller than 3 times $x_2$.

In each of the oxide semiconductor 604a and the oxide semiconductor 604c, the proportions of In and M when summation of In and M is assumed to be 100 atomic % are preferably less than 50 atomic % and greater than or equal to 50 atomic %, respectively, more preferably less than 25 atomic % and greater than or equal to 75 atomic %, respectively. The proportions of In and M in the oxide semiconductor 604b when summation of In and M is assumed to be 100 atomic % are preferably greater than or equal to 25 atomic % and less than 75 atomic %, respectively, more preferably greater than or equal to 34 atomic % and less than 66 atomic %, respectively.

The thicknesses of the oxide semiconductor 604a and the oxide semiconductor 604c are each greater than or equal to 3 nm and less than or equal to 100 nm, preferably greater than or equal to 3 nm and less than or equal to 50 nm. The thickness of the oxide semiconductor 604b is greater than or equal to 3 nm and less than or equal to 200 nm, preferably greater than or equal to 3 nm and less than or equal to 100 nm, more preferably greater than or equal to 3 nm and less than or equal to 50 nm. In addition, the oxide semiconductor 604b is preferably thicker than the oxide semiconductor 604a and the oxide semiconductor 604c.

For the oxide semiconductor 604a, the oxide semiconductor 604b, and the oxide semiconductor 604c, an oxide semiconductor containing indium, zinc, and gallium can be used, for example. In particular, the second oxide semiconductor 604b preferably contains indium because carrier mobility can be increased.

Note that as the gate insulating film of the transistor, an insulating film containing silicon is used in many cases; thus, considering that silicon degrades the characteristics of the transistor as described in Embodiment 2, it is preferable that a channel region of the multilayer oxide semiconductor be not in contact with the gate insulating film as in the transistor of this embodiment. When the channel is formed at the interface between the gate insulating film and the multilayer oxide semiconductor, scattering of carriers might occur at the interface, resulting in a decrease in the field-effect mobility of the transistor. In view of also the above, it is preferable that the channel region of the multilayer oxide semiconductor be apart from the gate insulating film.

With the multilayer oxide semiconductor 604 having a layered structure of the oxide semiconductors 604a, 604b, and 604c, a channel can be formed in the oxide semiconductor 604b; thus, the transistor can have high field-effect mobility and stable electrical characteristics.

Next, the band structure of the multilayer oxide semiconductor 604 will be described. In analyzing the band structure, a stack corresponding to the multilayer oxide semiconductor 604 is formed. In the stack, an In—Ga—Zn oxide with an energy gap of 3.5 eV is used for layers corresponding to the oxide semiconductor 604a and the oxide semiconductor 604c, and an In—Ga—Zn oxide with an energy gap of 3.15 eV is used for a layer corresponding to the oxide semiconductor 604b.

The energy gaps of the oxide semiconductor 604a, the oxide semiconductor 604b, and the oxide semiconductor 604c are measured with the use of a spectroscopic ellipsometer (UT-300 manufactured by HORIBA Jobin Yvon) under the condition where the thickness of each of the oxide semiconductors is set to 10 nm. The energy difference between the vacuum level and the top of the valence band is measured using an ultraviolet photoelectron spectroscopy (UPS) device (VersaProbe manufactured by ULVAC-PHI, Inc.).

Figure 17A:
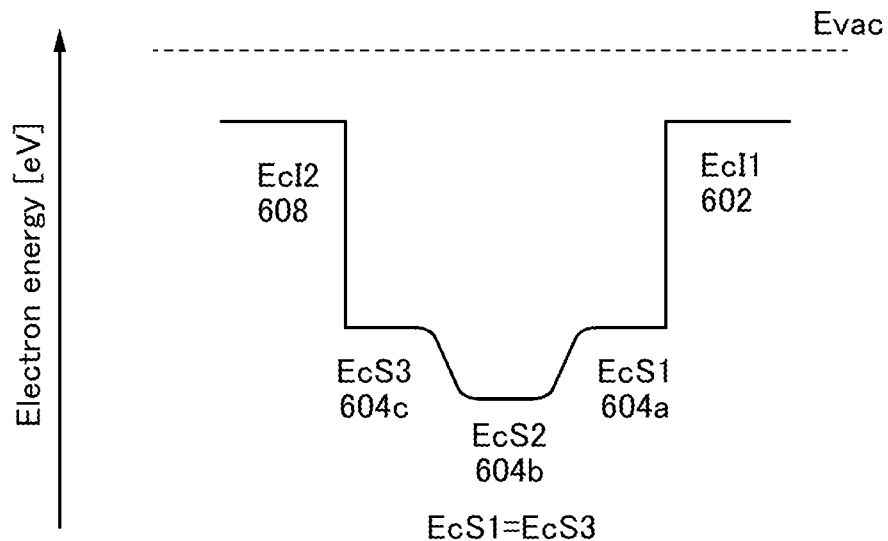
FIGS. 17A and 17B each show an example of a band diagram of a multilayer oxide semiconductor.

FIG. 17A schematically shows part of a band structure of an energy gap (electron affinity) between the vacuum level and the bottom of the conduction band of each layer, which is calculated by subtracting the energy gap of each layer from the energy gap between the vacuum level and the top of the valence band. FIG. 17A is a band diagram showing the case where silicon oxide films are provided in contact with the oxide semiconductor 604a and the oxide semiconductor 604c. Here, Evac represents energy of the vacuum level, EcI1 and EcI2 each represent energy at the bottom of conduction band of the silicon oxide film, EcS1 represents energy at the bottom of the conduction band of the oxide semiconductor 604a, EcS2 represents energy at the bottom of the conduction band of the oxide semiconductor 604b, and EcS3 represents energy at the bottom of the conduction band of the oxide semiconductor 604c.

As illustrated in FIG. 17A, energies of the bottoms of the conduction bands of the oxide semiconductor 604a, the oxide semiconductor 604b, and the oxide semiconductor 604c are continuously changed. This can be understood also from the fact that the constituent elements are common among the oxide semiconductor 604a, the oxide semiconductor 604b, and the oxide semiconductor 604c and oxygen is easily diffused. Thus, the oxide semiconductor 604a, the oxide semiconductor 604b, and the oxide semiconductor 604c have a continuous physical property although they have different compositions and form a stack.

Note that the multilayer oxide semiconductor 604 in which layers containing the same main components are stacked is not formed by simply stacking layers but is formed to have a continuous energy band (here, in particular, a well structure having a U shape in which energies of the bottoms of the conduction bands are changed continuously between layers). In other words, the layered structure is formed so that there exists no impurities that form a defect level such as a trap center or a recombination center at each interface. If an impurity exists between the layers in the multilayer oxide semiconductor 604, continuity of the energy band is lost, and thus carriers are trapped or disappear by recombination at the interface.

Note that FIG. 17A shows the case where EcS1 and EcS3 are similar to each other; however, EcS1 and EcS3 may be different from each other. For example, FIG. 17B shows part of the band structure in which EcS1 is higher than EcS3.

For example, when EcS1 is equal to EcS3, an In—Ga—Zn oxide whose atomic ratio of In to Ga and Zn is 1:3:2, 1:3:3, 1:3:4, 1:6:4, or 1:9:6 can be used for the oxide semiconductor 604a and the oxide semiconductor 604c and an In—Ga—Zn oxide whose atomic ratio of In to Ga and Zn is 1:1:1 or 3:1:2 can be used for the oxide semiconductor 604b. Further, when EcS1 is higher than EcS3, an In—Ga—Zn oxide whose atomic ratio of In to Ga and Zn is 1:6:4 or 1:9:6 can be used for the oxide semiconductor 604a, an In—Ga—Zn oxide whose atomic ratio of In to Ga and Zn is 1:1:1 or 3:1:2 can be used for the oxide semiconductor 604b, and an In—Ga—Zn oxide whose atomic ratio of In to Ga and Zn is 1:3:2, 1:3:3, or 1:3:4 can be used for the oxide semiconductor 604c, for example.

Figure 17B:
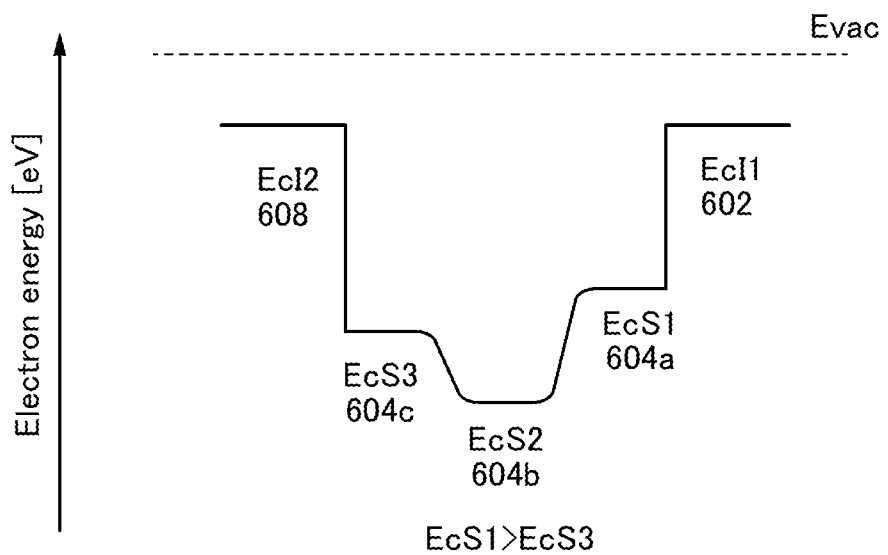

According to FIGS. 17A and 17B, the oxide semiconductor 604b of the multilayer oxide semiconductor 604 serves as a well, so that a channel is formed in the oxide semiconductor 604b in a transistor including the multilayer oxide semiconductor 604. Note that since the energies at the conduction band bottom are changed continuously, the multilayer oxide semiconductor 604 can also be referred to as a U-shaped well. A channel formed to have such a structure can also be referred to as a buried channel.

Note that trap states resulting from impurities or defects can be formed in the vicinity of the interfaces between the oxide semiconductor 604a and an insulating film such as the silicon oxide film and between the oxide semiconductor 604c and such an insulating film. The oxide semiconductor 604b can be apart from the trap states owing to the existence of the oxide semiconductor 604a and the oxide semiconductor 604c. However, when the energy difference between EcS2 and EcS1 or EcS3 is small, an electron in the oxide semiconductor 604b might reach the trap state across the energy difference. When the electron is trapped by the trap state, a negative fixed charge is generated at the interface with the insulating film, whereby the threshold voltage of the transistor is shifted in the positive direction.

Thus, to reduce variation in the threshold of the transistor, energy differences between EcS2 and each of EcS1 and EcS3 are necessary. Each of the energy differences is preferably greater than or equal to 0.1 eV, more preferably greater than or equal to 0.15 eV.

The oxide semiconductor 604a, the oxide semiconductor 604b, and the oxide semiconductor 604c preferably include crystal parts. In particular, when crystals in which c-axes are aligned are used, the transistor can have stable electrical characteristics.

In the case where an In—Ga—Zn oxide is used as the multilayer oxide semiconductor 604, it is preferable that the In content in the oxide semiconductor 604c be lower than that in the oxide semiconductor 604b so that diffusion of In to the gate insulating film can be prevented.

For the source electrode 606a and the drain electrode 606b, a conductive material that is easily bonded to oxygen is preferably used. For example, Al, Cr, Cu, Ta, Ti, Mo, or W can be used. Among the materials, it is particularly preferable to use Ti, which is easily bonded to oxygen, or W with a high melting point, which allows subsequent process temperatures to be relatively high. Note that the conductive material that is easily bonded to oxygen includes, in its category, a material to which oxygen is easily diffused.

When the conductive material that is easily bonded to oxygen is in contact with an oxide semiconductor layer, a phenomenon occurs in which oxygen in the oxide semiconductor layer is diffused to the conductive material that is easily bonded to oxygen. The phenomenon noticeably occurs when the temperature is high. Since the manufacturing process of the transistor includes a heat treatment step, the above phenomenon causes generation of oxygen vacancies in the vicinity of a region that is in the oxide semiconductor layer and is in contact with the source electrode layer or the drain electrode layer. The oxygen vacancies are bonded to hydrogen slightly contained in the film, whereby the region is changed into an n-type region. Accordingly, the n-type region can serve as a source or a drain of the transistor.

In the case of forming a transistor with an extremely short channel length, the n-type region formed by the generation of the oxygen vacancies might extend in the channel length direction of the transistor. In that case, the electric characteristics of the transistor change; for example, the threshold voltage is shifted, or on/off of the transistor is hard to control with the gate voltage (in which case the transistor is turned on). Accordingly, when a transistor with an extremely short channel length is formed, it is not always preferable that a conductive material that is easily bonded to oxygen be used for a source electrode layer and a drain electrode layer.

In such a case, a conductive material that is less likely to be bonded to oxygen than the above material is can be used for the source electrode 606a and the drain electrode 606b. As the conductive material, for example, a material containing tantalum nitride, titanium nitride, gold, platinum, palladium, or ruthenium or the like can be used. Alternatively, the source electrode 606a and the drain electrode 606b may each have a structure where the conductive material that is less likely to be bonded to oxygen and the above conductive material that is likely to be bonded to oxygen are stacked.

A gate insulating film 608 is formed using a material that is used for the gate insulating film 535 of Embodiment 2. A gate electrode 610 is formed using a material that is used for the gate electrode 536a and the conductive layer 536b of Embodiment 2. The oxide insulating film 612 may be formed over the gate insulating film 608 and the gate electrode 610. The oxide insulating film 612 is formed using a material that is used for the interlayer insulating film 537 of Embodiment 2.

High integration of a semiconductor device requires miniaturization of a transistor. However, it is known that miniaturization of a transistor causes degradation of the electric characteristics of the transistor. A decrease in channel width causes a reduction in on-state current.

However, in the transistor of this embodiment, as described above, the oxide semiconductor 604c is formed so as to cover the channel formation region of the oxide semiconductor 604b, and the channel formation layer and the gate insulating film are not in contact with each other. Accordingly, scattering of carriers at the interface between the channel formation layer and the gate insulating film can be reduced, increasing the field-effect mobility of the transistor.

In the transistor of this embodiment, the oxide semiconductor 604b is formed over the oxide semiconductor 604a, so that an interface state is less likely to be formed. In addition, impurities do not enter the oxide semiconductor 604b from above and below because the oxide semiconductor 604b is an intermediate layer in the three-layer structure. Owing to the structure in which the oxide semiconductor 604b is surrounded by the oxide semiconductor 604a and the oxide semiconductor 604c (and electrically covered with the gate electrode 610), not only can the on-state current of the transistor be increased but also the threshold can be stabilized and the S value can be reduced. Thus, a source-drain current (Icut) when the potential of the gate electrode is equal to the potential of the source electrode can be reduced and power consumption of can be reduced. Furthermore, the threshold of the transistor becomes stable; thus, long-term reliability of the semiconductor device can be improved.

Note that it is possible that in a step of forming the source electrode 606a and the drain electrode 606b, a conductive film to be the source electrode 606a and the drain electrode 606b be not over-etched and thus the base insulating film 602 be not etched. In order to prevent etching of the base insulating film 602 caused by over-etching of the conductive film, the etching selectivity of the conductive film to the base insulating film 602 is set high.

Although in this embodiment, the oxide semiconductor 604b is sandwiched between the oxide semiconductor 604a and the oxide semiconductor 604c, one embodiment of the present invention is not limited to this structure. A structure where neither the oxide semiconductor 604a nor the oxide semiconductor 604c is provided and only the oxide semiconductor 604b is electrically covered with the gate electrode may be employed.

Next, a method for manufacturing the transistor 600 illustrated in FIGS. 16A to 16C will be described with reference to FIGS. 18A to 18C and FIGS. 19A to 19C.

Figure 18A:
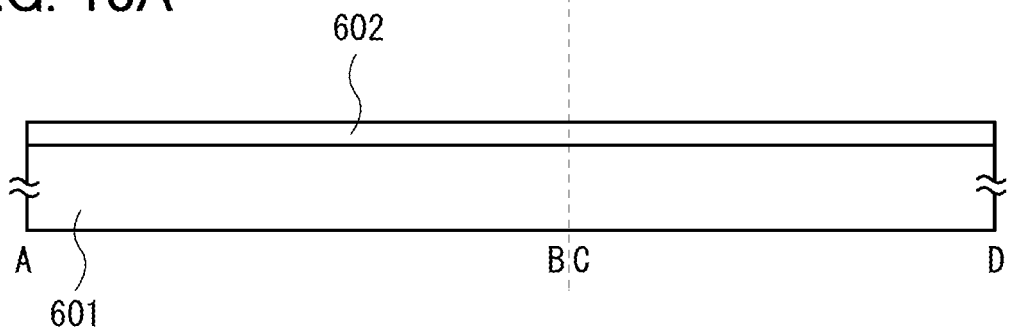
FIGS. 18A to 18C illustrate an example of a fabricating process of a transistor included in a signal processing device.

First, the base insulating film 602 is formed over the insulating film 601 (see FIG. 18A).

The base insulating film 602 can be formed by a plasma CVD method, a sputtering method, or the like using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride, aluminum nitride oxide, or the like, or a mixed material of any of these. Alternatively, a stack including any of the above materials may be used, and at least an upper layer of the base insulating film 602 that is in contact with the multilayer semiconductor 604 is preferably formed using a material containing excess oxygen that might serve as a supply source of oxygen to the multilayer semiconductor 604.

Oxygen may be added to the base insulating film 602 by an ion implantation method, an ion doping method, a plasma immersion ion implantation method, or the like. Adding oxygen enables the base insulating film 602 to supply oxygen more easily to the multilayer oxide semiconductor 604.

In the case where the surface of the insulating film 601 is made of an insulator and there is no influence of impurity diffusion to the multilayer oxide semiconductor 604 to be formed later, the base insulating film 602 is not necessarily provided.

Figure 18B:
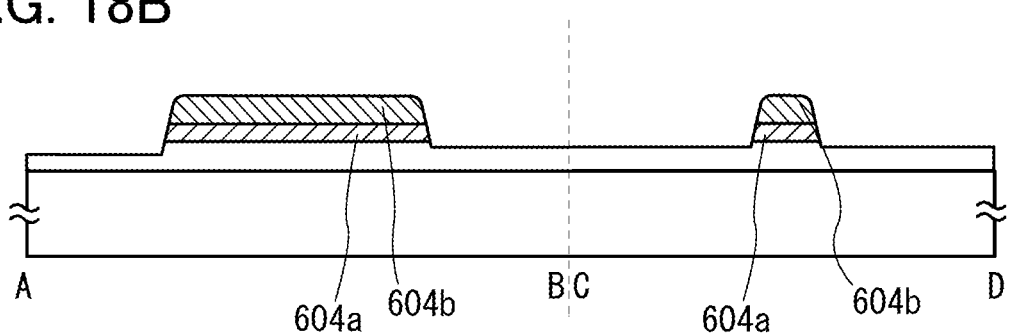

Next, the oxide semiconductor 604a and the oxide semiconductor 604b are formed over the base insulating film 602 by a sputtering method, a CVD method, an MBE method, an ALD method, or a PLD method (see FIG. 18B). At this time, the base insulating film 602 may also be etched slightly as illustrated in FIG. 18B. The slightly etched base insulating film 602 enables the oxide semiconductor 604c to be easily covered by the gate electrode 610 that is formed later.

In processing the oxide semiconductor 604a and the oxide semiconductor 604b into island shapes, first, a film to be a hard mask (e.g., a tungsten film) and a resist mask are provided over the oxide semiconductor 604b, and the film to be a hard mask is etched to form a hard mask. Then, the resist mask is removed, and with the use of the hard mask, the oxide semiconductor 604a and the oxide semiconductor 604b are etched. After that, the hard mask is removed. At the time of the etching, an end portion of the hard mask is gradually reduced over the etching time; as a result, the end portion of the hard mask is rounded to have a curved surface. Accordingly, an end portion of the oxide semiconductor 604b is also rounded to have a curved surface. With this structure, the coverage with the oxide semiconductor 604c, the gate insulating film 608, the gate electrode 610, and the oxide insulating film 612, which are to be formed over the oxide semiconductor 604b, can be improved; thus, occurrence of a shape defect such as disconnection can be inhibited. In addition, electric field concentration which might occur at end portions of the source electrode 606a and the drain electrode 606b can be reduced, which can inhibit deterioration of the transistor.

In order to form a continuous energy band in a stack including the oxide semiconductor 604a and the oxide semiconductor 604b and a stack including the oxide semiconductor 604c to be formed in a later step as well as the oxide semiconductor 604a and the oxide semiconductor 604b, the layers need to be formed successively without exposure to the air with the use of a multi-chamber deposition apparatus (e.g., a sputtering apparatus) including a load lock chamber. It is preferable that each chamber of the sputtering apparatus be able to be evacuated to a high vacuum (to approximately $5 \times 10^{-7}$ Pa to $1 \times 10^{-4}$ Pa) by an adsorption vacuum pump such as a cryopump and that the chamber be able to heat a substrate over which a film is to be deposited to 100° C. or higher, preferably 500° C. or higher so that water and the like as impurities of the oxide semiconductor are removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation in a chamber but also high purity of a sputtering gas is necessary to obtain a high-purity intrinsic oxide semiconductor. When a highly purified gas having a dew point of −40° C. or lower, preferably −80° C. or lower, more preferably −100° C. or lower is used as an oxygen gas or an argon gas used as a sputtering gas, moisture or the like can be prevented from entering the oxide semiconductor film as much as possible.

For the oxide semiconductor 604a, the oxide semiconductor 604b, and the oxide semiconductor 604c formed in the later step, any of the materials described in Embodiment 2 can be used. For example, an In—Ga—Zn oxide whose atomic ratio of In to Ga and Zn is 1:3:4 or 1:3:2 can be used for the oxide semiconductor 604a, an In—Ga—Zn oxide whose atomic ratio of In to Ga and Zn is 1:1:1 can be used for the oxide semiconductor 604b, and an In—Ga—Zn oxide whose atomic ratio of In to Ga and Zn is 1:3:4 or 1:3:2 can be used for the oxide semiconductor 604c.

An oxide semiconductor that can be used for each of the oxide semiconductor 604a, the oxide semiconductor 604b, and the oxide semiconductor 604c preferably contains at least indium (In) or zinc (Zn). Alternatively, both In and Zn are preferably contained. In order to reduce fluctuations in electric characteristics of the transistor including the oxide semiconductor, the oxide semiconductor preferably contains a stabilizer in addition to In and Zn.

Examples of the stabilizer include gallium (Ga), tin (Sn), hafnium (Hf), aluminum (Al), and zirconium (Zr). Other examples of the stabilizer include lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, for example, any of the following can be used: an indium oxide, a tin oxide, a zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

Note that here, for example, an "In—Ga—Zn oxide" means an oxide containing In, Ga, and Zn as its main components. The In—Ga—Z-based oxide may contain another metal element in addition to In, Ga, and Zn. Further, in this specification, a film formed using an In—Ga—Zn oxide is also referred to as an IGZO film.

Alternatively, a material represented by $InMO_3(ZnO)_m$ (m>0, m is not an integer) may be used. Note that M represents one or more metal elements selected from Ga, Fe, Mn, and Co. Alternatively, a material represented by $In_2SnO_5(ZnO)_n$ (n>0, n is an integer) may be used.

Note that materials are selected so that the oxide semiconductor 604a and the oxide semiconductor 604c each have an electron affinity lower than that of the oxide semiconductor 604b.

Note that the oxide semiconductor film is preferably formed by a sputtering method. As the sputtering method, an RF sputtering method, a DC sputtering method, an AC sputtering method, or the like can be used. In particular, a DC sputtering method is preferably employed because dust generated in the deposition can be reduced and the film thickness can be uniform.

In the case of using an In—Ga—Zn oxide, a material whose atomic ratio of In to Ga and Zn is any of 1:1:1, 2:2:1, 3:1:2, 1:3:2, 1:3:4, 1:4:3, 1:5:4, 1:6:6, 2:1:3, 1:6:4, 1:9:6, 1:1:4, and 1:1:2 is used for the oxide semiconductor 604a, the oxide semiconductor 604b, and the oxide semiconductor 604c so that the oxide semiconductor 604a and the oxide semiconductor 604c each have an electron affinity lower than that of the oxide semiconductor 604b.

Note that for example, the expression "the composition of an oxide containing In, Ga, and Zn at the atomic ratio of In:Ga:Zn=a:b:c (a+b+c=1) is in the neighborhood of the composition of an oxide containing In, Ga, and Zn at the atomic ratio of In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The indium content of the oxide semiconductor 604b is preferably higher than those of the oxide semiconductor 604a and the oxide semiconductor 604c. In an oxide semiconductor, the s orbital of heavy metal mainly contributes to carrier transfer, and as the proportion of In in the oxide semiconductor is increased, overlap of the s orbitals is increased. Therefore, an oxide having a composition in which the proportion of In is higher than that of Ga has higher mobility than an oxide having a composition in which the proportion of In is equal to or lower than that of Ga. Thus, the use of an oxide having a high indium content for the oxide semiconductor 604b enables fabrication of a transistor having high mobility.

After the oxide semiconductor 604b is formed, first heat treatment may be performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then in order to compensate desorbed oxygen, another heat treatment is performed in an atmosphere containing an oxidizing gas at 10 ppm or more. By the first heat treatment, the crystallinity of the oxide semiconductor 604*b* can be improved, and in addition, impurities such as hydrogen and water can be removed from the base insulating film 602 and the oxide semiconductor 604*a*. Note that the first heat treatment may be performed before etching for formation of the oxide semiconductor 604*b*.

Then, a first conductive film to be the source electrode 606*a* and the drain electrode 606*b* is formed over the oxide semiconductors 604*a* and 604*b*. For the first conductive film, Al, Cr, Cu, Ta, Ti, Mo, W, or an alloy material containing any of these as its main component can be used. For example, a 100-nm-thick titanium film is formed by a sputtering method or the like. Alternatively, a tungsten film may be formed by a CVD method.

Figure 18C:
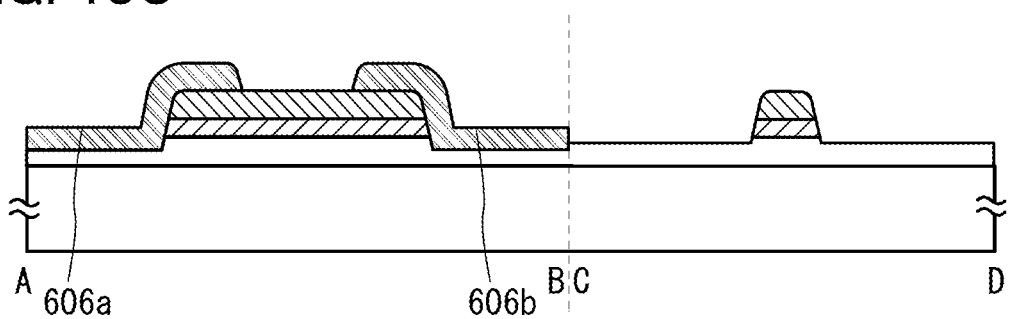

Then, the first conductive film is etched so as to be divided over the second oxide semiconductor 604*b* to form the source electrode 606*a* and the drain electrode 606*b* (see FIG. 18C).

Next, an oxide semiconductor film 603*c* is formed over the oxide semiconductor 604*b*, the source electrode 606*a*, and the drain electrode 606*b*.

Note that second heat treatment may be performed after the oxide semiconductor film 603*c* is formed. The second heat treatment can be performed under the condition similar to that of the first heat treatment. The second heat treatment can remove impurities such as hydrogen and water from the oxide semiconductor film 603*c*. In addition, impurities such as hydrogen and water can be further removed from the oxide semiconductors 604*a* and 604*b*.

Figure 19A:
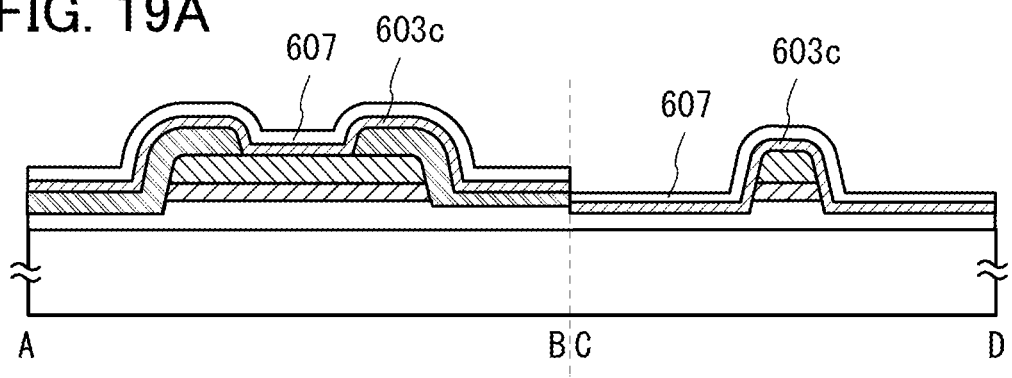
FIGS. 19A to 19C illustrate an example of a fabricating process of a transistor included in a signal processing device.

Next, an insulating film 607 to be the gate insulating film 608 is formed over the oxide semiconductor film 603*c* (see FIG. 19A). The insulating film 607 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, hafnium oxide, aluminum oxide, aluminum silicate, neodymium oxide, and tantalum oxide. The insulating film 607 may be a stack including any of the above materials. The insulating film 607 can be formed by a sputtering method, a CVD method, an MBE method, an ALD method, a PLD method, or the like.

Figure 19B:
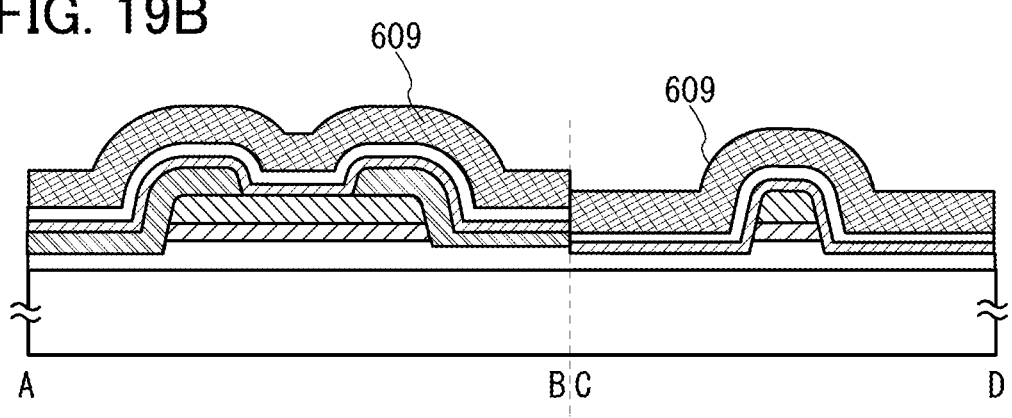

Then, a second conductive film 609 to be the gate electrode 610 is formed over the insulating film 607 (see FIG. 19B). For the second conductive film 609, Al, Ti, Cr, Co, Ni, Cu, Y, Zr, Mo, Ru, Ag, Ta, W, or an alloy material containing any of these as its main component can be used. The second conductive film 609 can be formed by a sputtering method, a CVD method, or the like. A stack including the above conductive film and a conductive film containing nitrogen, or a conductive film containing nitrogen may be used for the second conductive film 609.

Figure 19C:
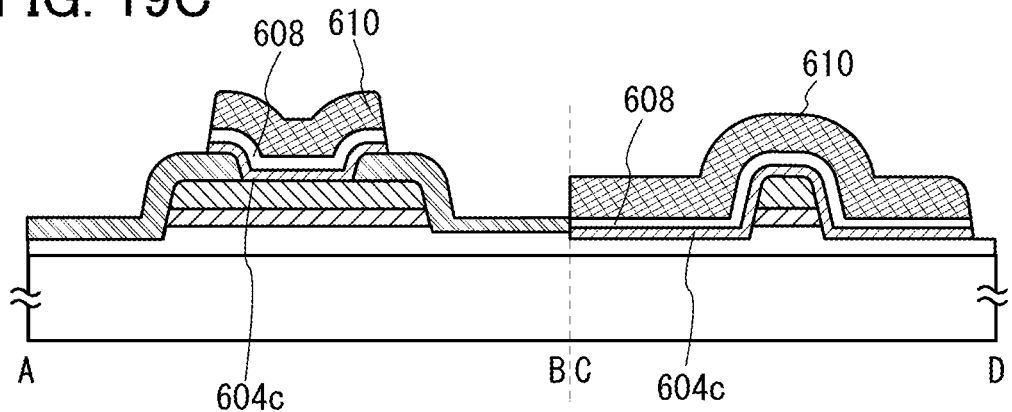

After that, the second conductive film 609 is selectively etched using a resist mask to form the gate electrode 610 (see FIG. 19C). Note that as illustrated in FIG. 16C, the gate electrode 610 electrically cover the oxide semiconductor 604*b*.

Then, the insulating film 607 is selectively etched using the resist mask or the gate electrode 610 as a mask to form the gate insulating film 608.

Then, the oxide semiconductor film 603*c* is etched using the resist mask or the gate electrode 610 as a mask to form the oxide semiconductor 604*c*.

A top end portion of the oxide semiconductor 604*c* is aligned with a bottom end portion of the gate insulating film 608. A top end portion of the gate insulating film 608 is aligned with a bottom end portion of the gate electrode 610. Although the gate insulating film 608 and the oxide semiconductor 604*c* are formed using the gate electrode 610 as a mask, the gate insulating film 608 and the oxide semiconductor 604*c* may be formed before the second conductive film 609 is formed.

Next, the oxide insulating film 612 is formed over the source electrode 606*a*, the drain electrode 606*b*, and the gate electrode 610 (see FIGS. 16B and 16C). A material and a method for the oxide insulating film 612 can be similar to those of the base insulating film 602. The oxide insulating film 612 may be formed using aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or an oxide insulating film containing nitrogen. The oxide insulating film 612 can be formed by a sputtering method, a CVD method, an MBE method, an ALD method, or a PLD method, and is preferably formed so as to contain excess oxygen to supply oxygen to the multilayer oxide semiconductor 604.

Oxygen may be added to the oxide insulating film 612 by an ion implantation method, an ion doping method, a plasma immersion ion implantation method, or the like. Adding oxygen enables the oxide insulating film 612 to supply oxygen more easily to the multilayer oxide semiconductor 604.

Next, third heat treatment may be performed. The third heat treatment can be performed under the condition similar to that of the first heat treatment. By the third heat treatment, excess oxygen is easily released from the base insulating film 602, the gate insulating film 608, and the oxide insulating film 612, so that oxygen vacancies in the multilayer oxide semiconductor 604 can be reduced.

Next, fourth heat treatment is performed. The fourth heat treatment is performed at a temperature higher than or equal to 125° C. and lower than or equal to 450° C., preferably higher than or equal to 150° C. and lower than or equal to 300° C. under the conditions where the potential of the gate electrode 610 which is higher than those of the source and the drain is maintained for a second or more, typically one minute or more, so that necessary electrons transfer from the multilayer oxide semiconductor 604 toward the gate electrode 610, and some of the electrons are trapped in an electron trap state. By controlling the number of trapped electrons, the increase of threshold can be controlled.

Through the above process, the transistor 600 illustrated in FIGS. 16A to 16C can be fabricated.

This embodiment can be combined with any of the other embodiments in this specification as appropriate.

Embodiment 4

In this embodiment, an example of the signal processing device described in the above embodiment will be described. Examples of the signal processing devices include devices including wireless communication units, such as computers, various portable information terminals (including mobile phones, portable game machines, audio reproducing devices, and the like), electronic paper, and wireless keyboards. A refrigerator, an air conditioner, an automobile, a washing machine, a cooking device (e.g., a microwave oven) may be provided with a wireless communication unit including the signal processing device described in the above embodiment, so as to be remotely controlled by a computer or any of various portable information terminals.

Figure 20A:
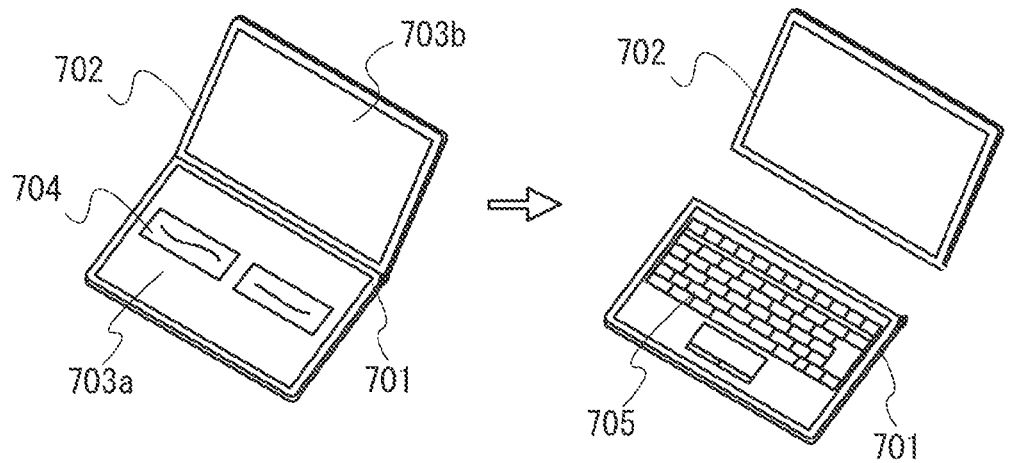
FIGS. 20A to 20D each illustrate an example of an electronic device utilizing a signal processing device.

FIG. 20A illustrates a portable information terminal that includes a housing 701, a housing 702, a first display portion 703a, a second display portion 703b, and the like. The signal processing circuit described in the above embodiment is provided in at least one of the housing 701 and the housing 702. Thus, the portable information terminal can achieve low power consumption and operate without a decrease in performance even when power supply to some of the circuits included in the signal processing circuit is stopped.

Note that the first display portion 703a is a touch panel, and for example, as illustrated in the left of FIG. 20A, which of "touch input" and "keyboard input" is performed can be selected by a selection button 704 displayed on the first display portion 703a. The selection button can be displayed in a variety of sizes; thus, the portable information terminal can be easily used by people of any generation. In the case where "keyboard input" is selected, for example, a keyboard 705 is displayed on the first display portion 703a as illustrated in the right of FIG. 20A. With such a structure, text can be input quickly by keyboard input as in the case of using a conventional information terminal, for example.

Furthermore, one of the first display portion 703a and the second display portion 703b can be detached from the portable information terminal as illustrated in the right in FIG. 20A. When the first display portion 703b is also a touch panel, the information terminal has a further reduced weight and thus is easy to carry, which is convenient because operation can be performed with one hand while the other hand supports the housing 702.

The portable information terminal illustrated in FIG. 20A can have a function of displaying various kinds of information (e.g., a still image, a moving image, and a text image); a function of displaying a calendar, the date, the time, and the like on the display portion; a function of operating or editing the information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or a side surface of the housing.

With the portable information terminal illustrated in FIG. 20A, desired book data or the like can be purchased and downloaded from an electronic book server through wireless communication. Furthermore, the housing 702 illustrated in FIG. 20A may have an antenna, a microphone function, or a wireless communication function to be used as a mobile phone. Note that data communication between the housings 701 and 702 that are separated from each other can be performed through wireless communication.

Figure 20B:
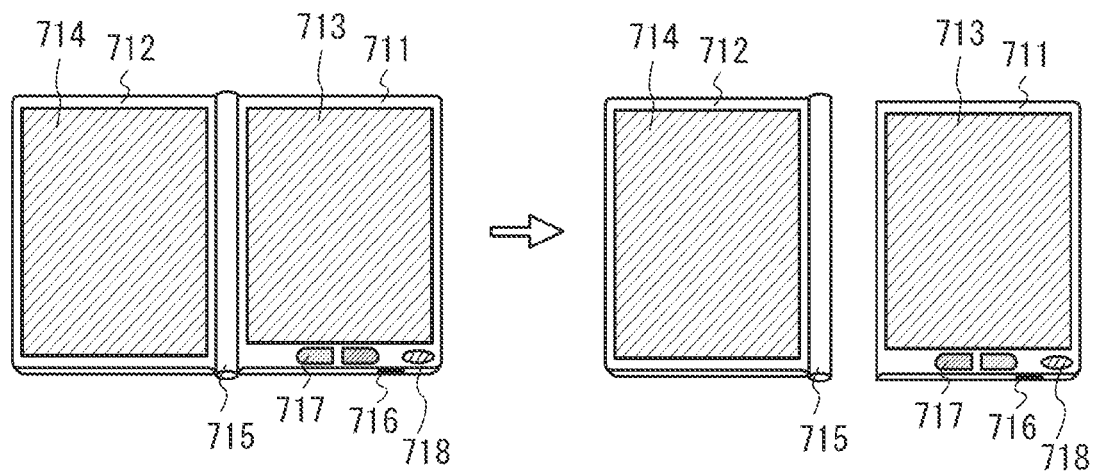

FIG. 20B illustrates an e-book reader incorporating electronic paper. The e-book reader includes two housings, a housing 711 and a housing 712. The housing 711 and the housing 712 include a display portion 713 and a display portion 714, respectively. For example, the display portion 714 may be formed using electronic paper and the display portion 713 may be formed using a display device that has a high response speed and is favorable for displaying a moving image, such as a liquid crystal display device or an organic light-emitting display device.

The housing 711 is connected to the housing 712 by a hinge 715, so that the e-book reader can be opened and closed using the hinge 715 as an axis. The housing 711 is provided with a power switch 716, operation keys 717, a speaker 718, and the like. At least one of the housings 711 and 712 is provided with the signal processing circuit described in the above embodiment. Thus, the e-book reader can achieve low power consumption and operate without a decrease in performance even when power supply to some of the circuits included in the signal processing circuit is stopped.

The housings 711 and 712 may each be provided with a secondary battery so as to be separately driven as in the right of FIG. 20B, for example. For example, the housing 712 may be provided with a communication device that can be connected to a mobile phone line and a device that complies with a short-distance wireless communication standard (e.g., wireless LAN or Bluetooth), and the housing 711 may be provided with a short-distance wireless communication device. In that case, data received by the housing 712 through the mobile phone line is transferred to the housing 711 using a short-distance wireless communication standard. Data input from the housing 711 is sent to the housing 712 using a short-distance wireless communication standard and then is sent to the mobile phone line. That is, the housing 712 functions as a wireless modem.

The housings 711 and 712 can be configured to sound an alarm or the housing 713 can be configured to display a message in the case where communication is (or might be) unintentionally interrupted because the distance between the housings 711 and 712 increases. In that case, a risk of losing the housings can be reduced.

In the case of such usage, for example, the housing 712 is usually put in a bag, and the housing 711 is held with a hand or placed at a position from which the housing 711 can be easily taken out (e.g., in a pocket of clothes), whereby simple operation can be performed by the housing 711. For example, part or all of data can be stored in the housing 712 and transmitted to the housing 712 using a short-distance wireless communication standard to be read or viewed on the housing 712 as needed.

Figure 20C:
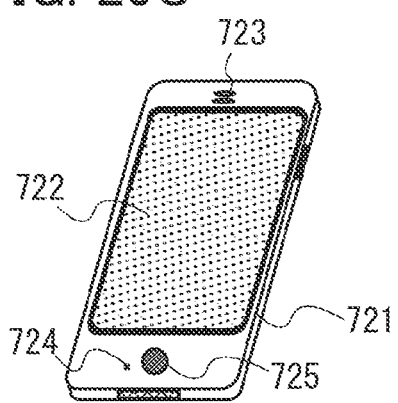

FIG. 20C is a smartphone. A housing 721 of the smartphone is provided with a display portion 722, a speaker 723, a microphone 724, an operation button 725, and the like. The signal processing circuit described in the above embodiment is provided in the housing 721. Thus, the smartphone can achieve low power consumption and operate without a decrease in performance even when power supply to some of the circuits included in the signal processing circuit is stopped.

Figure 20D:
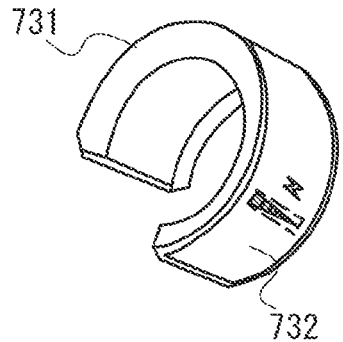

FIG. 20D is a wristband type display device including a housing 731, a display portion 732, and the like. In the housing 731, the signal processing circuit described in the above embodiment is provided. Thus, the wristband type display device can achieve low power consumption and operate without a decrease in performance even when power supply to some of the circuits included in the signal processing circuit is stopped.

As described above, the signal processing devices described in this embodiment each include the signal processing circuit of the above embodiment. Thus, it is possible to fabricate an electronic device that can achieve low power consumption and operate without a reduction in performance even when power supply to some of the circuits included in the signal processing circuit is stopped.

Embodiment 5

The signal processing devices each having a wireless communication function (RF devices) described in Embodiment 4 can communicate with each other. For the communication, a communication technology based on a short-distance wireless communication standard (e.g., wireless LAN or Bluetooth) is used. The communication can be performed without using a communication network of a telecommunications company. For example, sending an address book or a schedule is possible.

The case where the smartphone in FIG. 20C communicates with the wristband type display device in FIG. 20D will be described with reference to FIG. 21. FIG. 21 illustrates a state where an RF device 801 (smartphone) and an RF device 802 (wristband type display device) wirelessly communicate with each other.

For example, the RF device 802 mainly has the following circuit blocks: an RF block 803, a CPU 804, a display device 805, a sensor 806, a sound system 807, a secondary battery 808, and a DC-DC converter 809. Power is supplied from the secondary battery 808 to the RF block 803, the CPU 804, the display device 805, the sensor 806, and the sound system 807. To the display device 805, power whose voltage is boosted by the DC-DC converter 809 is supplied.

The RF block includes a signal processing circuit such as the amplifier described in the above embodiment. The potential obtained by voltage boosting using the DC-DC converter 809 can be used for the control signal SGa, for example. Examples of the sensor 806 include a temperature sensor and a UV sensor. The sound system 807 can generate audible sound or vibration.

As to the RF devices 801 and 802, for example, when the RF device 801 receives an e-mail or a phone call, the display device 805 of the RF device 802 can indicate the reception thereof or notification can be provided by sound or vibration using the sound system 807.

Furthermore, data sensed by the sensor 806 of the RF device 802 can be transmitted to the RF device to be processed. For example, when a temperature sensor is provided as the sensor 806, a body temperature can be measured using the temperature sensor, the measurement data can be transmitted to the RF device 801 at regular intervals, and control can be performed.

Alternatively, a UV sensor may be provided as the sensor 806. When UV at a predetermined level or higher is detected, data can be transmitted to the RF device 801 and the RF device 801 can generate an alarm, for example.

This application is based on Japanese Patent Application serial no. 2013-170067 filed with Japan Patent Office on Aug. 20, 2013, the entire contents of which are hereby incorporated by reference.

What is claimed is:

1. A signal processing device comprising:
 a first bias generation circuit including a first transistor, a first resistor, a second resistor and a third resistor;
 a potential holding portion including a second transistor and a capacitor;
 an amplifier circuit; and
 a first wiring to which an input signal is supplied,
 wherein a first terminal of the second transistor is electrically connected to a first terminal of the capacitor,
 wherein the first terminal of the capacitor is electrically connected to a gate terminal of the first transistor,
 wherein a first terminal of the first transistor is electrically connected to a first terminal of the first resistor and a first terminal of the amplifier circuit,
 wherein the first terminal of the first resistor is electrically connected to the first wiring and a second terminal of the amplifier circuit,
 wherein a first terminal of the second resistor is electrically connected to the first terminal of the first transistor,
 wherein a second terminal of the second resistor is electrically connected to the first terminal of the amplifier circuit,
 wherein a first terminal of the third resistor is electrically connected to the first terminal of the first resistor, and
 wherein a second terminal of the third resistor is electrically connected to the second terminal of the amplifier circuit.

2. The signal processing device according to claim 1, further comprising:
 a second bias generation circuit including a third transistor and a fourth resistor;
 a fourth transistor; and
 a second wiring supplying a potential,
 wherein a first terminal of the third transistor is electrically connected to a first terminal of the fourth resistor and a second terminal of the second transistor,
 wherein a second terminal of the fourth resistor is electrically connected to a first terminal of the fourth transistor,
 wherein a second terminal of the fourth transistor is electrically connected to the second wiring, and
 wherein a second terminal of the first transistor is electrically connected to the second wiring.

3. The signal processing device according to claim 1, further comprising:
 a second bias generation circuit including a third transistor and a fourth resistor;
 a fourth transistor; and
 a second wiring supplying a potential,
 wherein a first terminal of the third transistor is electrically connected to a first terminal of the fourth resistor and a second terminal of the second transistor,
 wherein a second terminal of the third transistor is electrically connected to a first terminal of the fourth transistor,
 wherein a second terminal of the fourth transistor is electrically connected to the second wiring, and
 wherein a second terminal of the first resistor is electrically connected to the second wiring.

4. The signal processing device according to claim 1, wherein the second transistor is stacked over the first transistor with an insulating film provided therebetween.

5. The signal processing device according to claim 4, wherein a channel formation region of the second transistor comprises an oxide semiconductor, and
 wherein a channel formation region of the first transistor comprises silicon.

6. The signal processing device according to claim 5, wherein an off-state current of the second transistor is less than or equal to $1 \times 10^{-19}$ A/μm when a voltage between the first terminal of the second transistor and a second terminal of the second transistor is 0.1 V to 10 V.

7. An electronic device capable of wireless communication, comprising the signal processing device according to claim 1.

8. A signal processing device comprising:
 a first bias generation circuit;
 a potential holding portion electrically connected to the first bias generation circuit;
 an amplifier circuit electrically connected to the first bias generation circuit;
 a first wiring configured to be supplied with an input signal and electrically connected to the first bias generation circuit and the amplifier circuit;
 a second bias generation circuit electrically connected to the potential holding portion; and
 a switch between a power source and the second bias generation circuit, wherein the potential holding portion includes a transistor and a capacitor electrically connected to each other, wherein the potential holding portion is configured to hold a first potential accumulated in the capacitor by turning off the transistor, wherein the first potential held in the potential holding portion is configured to be supplied to the first bias generation circuit, wherein the first bias generation circuit is configured to generate a second potential, wherein the second potential output from the first bias generation circuit is configured to be superimposed with the input signal and input to the amplifier circuit, wherein the switch is configured to control power supply to the second bias generation circuit, wherein the second bias generation circuit is configured to generate a third potential, and wherein the third potential is configured to be held in the potential holding portion as the first potential.

9. The signal processing device according to claim 8,
wherein the potential holding portion is stacked over the first bias generation circuit with an insulating film provided therebetween.

10. The signal processing device according to claim 9,
wherein a channel formation region of the transistor comprises an oxide semiconductor, and
wherein the first bias generation circuit is formed in a semiconductor substrate comprising silicon.

11. The signal processing device according to claim 10,
wherein an off-state current of the transistor is less than or equal to $1 \times 10^{-19}$ A/μm when a voltage between a source and a drain of the transistor is 0.1 V to 10 V.

12. An electronic device capable of wireless communication, comprising the signal processing device according to claim 8.

13. A driving method of a signal processing device,
the signal processing device comprising:
  a first bias generation circuit;
  a switch configured to control power supply to the first bias generation circuit,
  a potential holding portion electrically connected to the first bias generation circuit, the potential holding portion including a transistor and a capacitor;
  a second bias generation circuit electrically connected to the potential holding portion;
  an amplifier circuit electrically connected to the second bias generation circuit; and
  a wiring to which an input signal is supplied and which is electrically connected to the second bias generation circuit and the amplifier circuit,
the driving method comprising:
outputting a first bias potential from the first bias generation circuit;
turning on the transistor in response to a first control signal;
charging the capacitor at the first bias potential;
turning off the transistor in response to the first control signal to cut off connection between the capacitor and the first bias generation circuit, whereby the first bias potential is held at the capacitor;
supplying the first bias potential held in the capacitor to the second bias generation circuit;
outputting a second bias potential from the second bias generation circuit;
superimposing the input signal on the second bias potential;
supplying the second bias potential on which the input signal is superimposed to the amplifier circuit,
turning on the switch in response to a second control signal before outputting the first bias potential from the first bias generation circuit; and
turning off the switch in response to the second control signal after turning off the transistor.

* * * * *